(12) United States Patent
Lin et al.

(10) Patent No.: US 11,302,581 B2
(45) Date of Patent: Apr. 12, 2022

(54) GATE PROFILE CONTROL THROUGH SIDEWALL PROTECTION DURING ETCHING

(71) Applicant: Taiwan Semiconductor Manufacturing Co., Ltd., Hsinchu (TW)

(72) Inventors: Shih-Yao Lin, New Taipei (TW); Kuei-Yu Kao, Hsinchu (TW); Chih-Han Lin, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/867,158

(22) Filed: May 5, 2020

(65) Prior Publication Data

US 2021/0351281 A1 Nov. 11, 2021

(51) Int. Cl.
*H01L 29/78* (2006.01)
*H01L 21/8234* (2006.01)
(Continued)

(52) U.S. Cl.
CPC ........... *H01L 21/823456* (2013.01); *H01L 21/823431* (2013.01); *H01L 29/41791* (2013.01);
(Continued)

(58) Field of Classification Search
CPC ..... H01L 21/823431; H01L 21/823456; H01L 29/66795; H01L 29/785; H01L 29/66545;
(Continued)

(56) References Cited

U.S. PATENT DOCUMENTS 9,520,474 B2 * 12/2016 Chang ............... H01L 21/31138
10,446,662 B2 10/2019 Bih et al.
(Continued)

FOREIGN PATENT DOCUMENTS

DE 102019116395 A1 12/2019
KR 20160040979 A 4/2016
(Continued)

*Primary Examiner* — Errol V Fernandes
*Assistant Examiner* — Jeremy J Joy
(74) *Attorney, Agent, or Firm* — Slater Matsil, LLP

(57) ABSTRACT

A method includes depositing a dummy gate dielectric layer over a semiconductor region, depositing a dummy gate electrode layer, and performing a first etching process. An upper portion of the dummy gate electrode layer is etched to form an upper portion of a dummy gate electrode. The method further includes forming a protection layer on sidewalls of the upper portion of the dummy gate electrode, and performing a second etching process. A lower portion of the dummy gate electrode layer is etched to form a lower portion of the dummy gate electrode. A third etching process is then performed to etch the lower portion of the dummy gate electrode using the protection layer as an etching mask. The dummy gate electrode is tapered by the third etching process. The protection layer is removed, and the dummy gate electrode is replaced with a replacement gate electrode.

20 Claims, 37 Drawing Sheets

(51) Int. Cl.
*H01L 29/66* (2006.01)
*H01L 29/417* (2006.01)
*H01L 29/423* (2006.01)

(52) U.S. Cl.
CPC .... *H01L 29/42376* (2013.01); *H01L 29/6681* (2013.01); *H01L 29/66545* (2013.01); *H01L 29/66795* (2013.01); *H01L 29/785* (2013.01)

(58) Field of Classification Search
CPC ........... H01L 29/42376; H01L 27/0886; H01L 27/1211
See application file for complete search history.

(56) References Cited

U.S. PATENT DOCUMENTS

| | | |
|---|---|---|
| 10,515,955 B1 | 12/2019 | Lin et al. |
| 10,658,491 B2 | 5/2020 | Lin et al. |
| 10,777,466 B2 | 9/2020 | Huang et al. |
| 10,804,371 B2 | 10/2020 | Chang et al. |
| 10,854,519 B2 | 12/2020 | Chen et al. |
| 10,868,139 B2 * | 12/2020 | Lin .................... H01L 21/32139 |
| 2015/0069535 A1 * | 3/2015 | Chang ............... H01L 29/42376 257/411 |
| 2015/0115363 A1 * | 4/2015 | Chang ................. H01L 27/1211 257/347 |
| 2017/0005005 A1 * | 1/2017 | Chen ................ H01L 21/823431 |
| 2018/0102418 A1 * | 4/2018 | Bih .................... H01L 29/66545 |
| 2018/0277571 A1 * | 9/2018 | Chang ............... H01L 21/32137 |
| 2018/0308842 A1 * | 10/2018 | Lee ................. H01L 21/823456 |
| 2018/0350949 A1 * | 12/2018 | Chang ............... H01L 21/28114 |
| 2018/0350972 A1 * | 12/2018 | Chen ..................... H01L 29/785 |
| 2019/0386115 A1 * | 12/2019 | Lin ...................... H01L 21/762 |
| 2020/0006148 A1 * | 1/2020 | Chen ................. H01L 29/42376 |
| 2020/0006527 A1 | 1/2020 | Lin et al. |

FOREIGN PATENT DOCUMENTS

| | | |
|---|---|---|
| KR | 20170004827 A | 1/2017 |
| KR | 20190062131 A | 6/2019 |
| KR | 20190142273 A | 12/2019 |
| KR | 20200006148 A | 1/2020 |

* cited by examiner

GATE PROFILE CONTROL THROUGH SIDEWALL PROTECTION DURING ETCHING

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating the FinFETs are being developed.

The formation of FinFETs typically includes forming dummy gate stacks, and replacing the dummy gate stacks with replacement gate stacks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11B-1, 11B-2, and 11B-3 illustrate the heights of the transition levels of the sidewalls of replacement gates relative to the fin tops in accordance with some embodiments.

DETAILED DESCRIPTION

Figure 1:
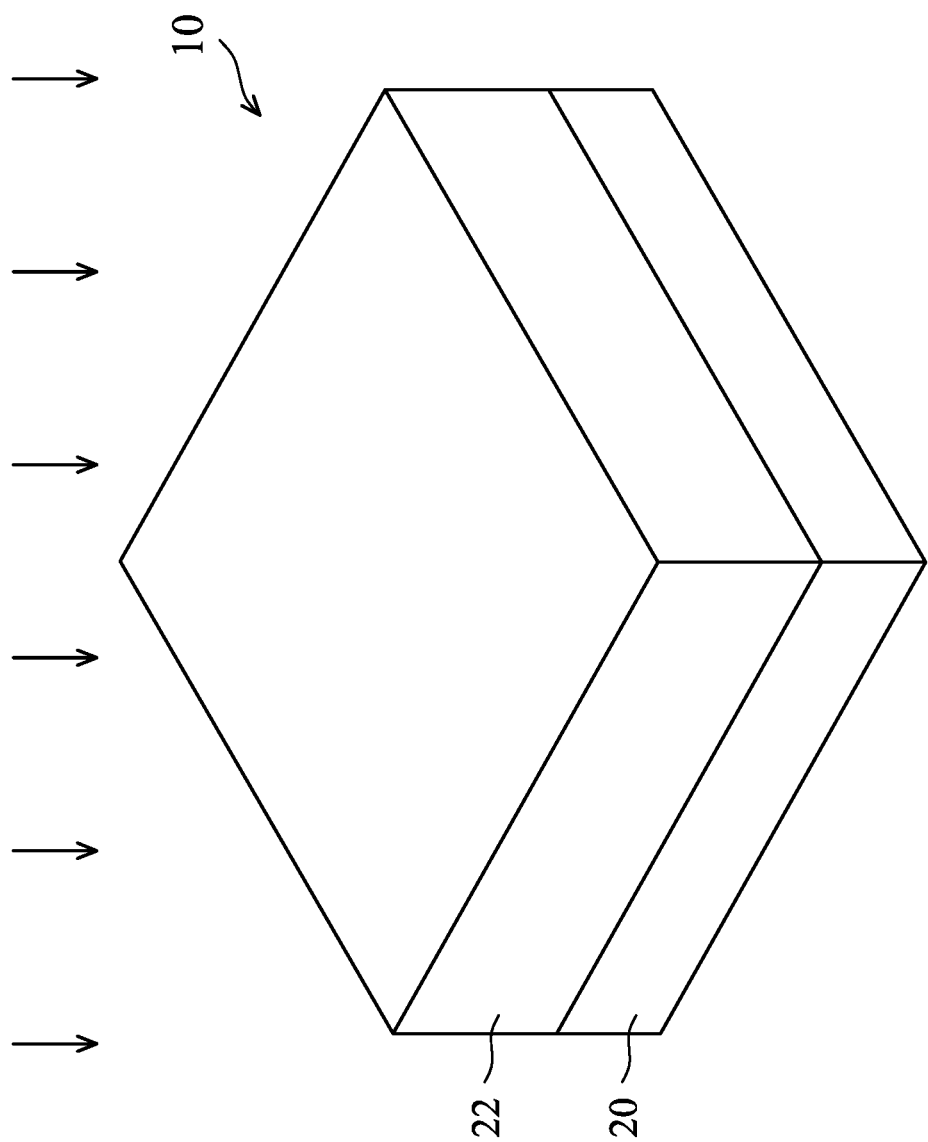
FIGS. 1-4, 5A, 5B, 6, 6A, 6B, 6C, 6D, 6E, 7-10, and 11A are perspective views and/or cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) having a replacement gate with narrower bottom end than the top end and the method of forming the same are provided in accordance with some embodiments. In accordance with some embodiments, the formation of dummy gate stacks is controlled, so that the dummy gate stacks have narrower bottom ends than the respective top ends, and hence the subsequent formation of replacement gates is easier, and the performance of the FinFET is improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
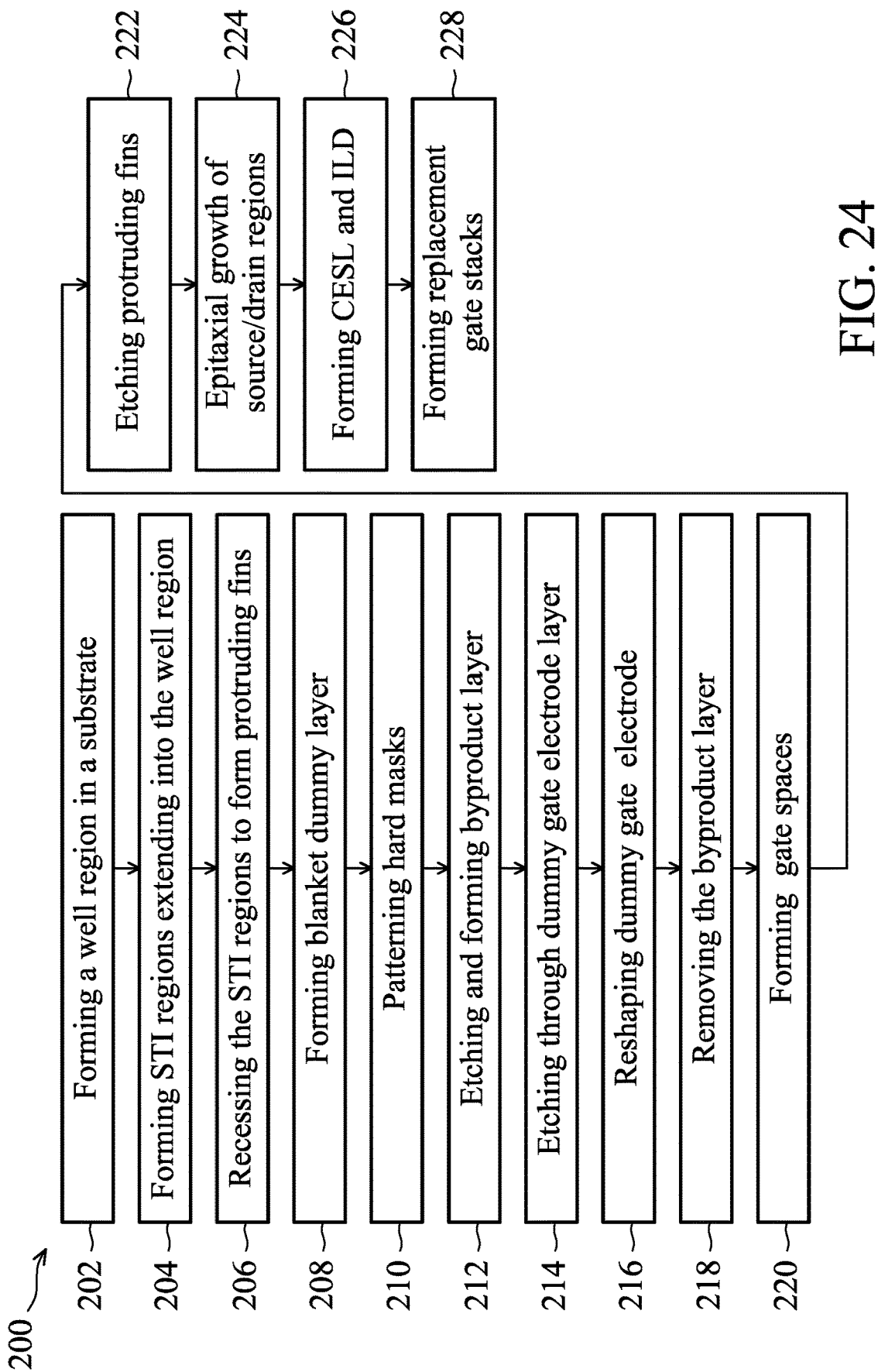
FIG. 24 illustrates a process flow for forming a FinFET in accordance with some embodiments.

FIGS. 1-4, 5A, 5B, 6, 6A, 6B, 6C, 6D, 6E, 7-10, and 11A are perspective views and/or cross-sectional views of intermediate stages in the formation of Fin Field-Effect Transistors (FinFETs) in accordance with some embodiments of the present disclosure. The corresponding processes are also reflected schematically in the process flow shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is shown as process 202 in the process flow 200 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
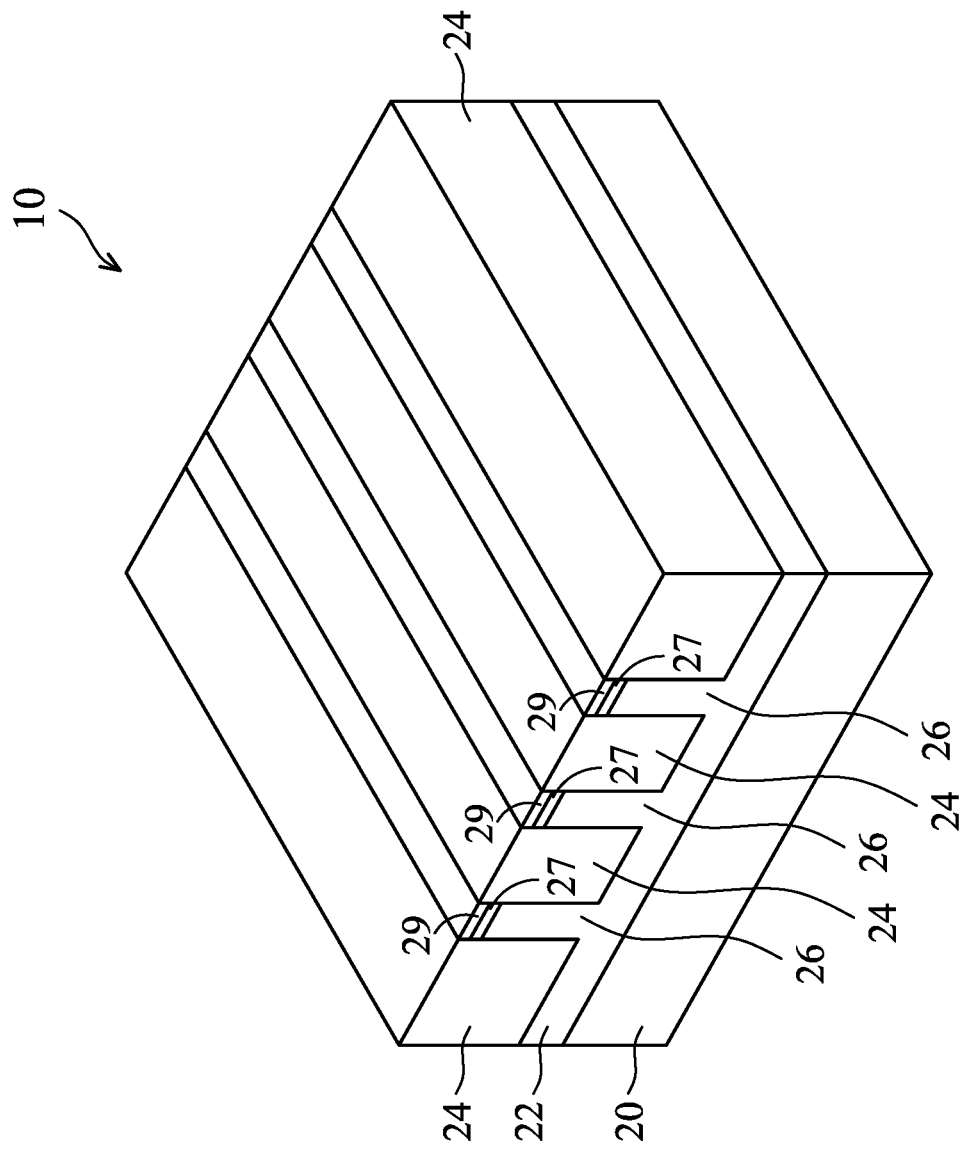

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is shown as process 204 in the process flow 200 shown in FIG. 24. The portions of substrate 20 between neighboring STI regions 24 are referred to as semiconductor strips 26. To form STI regions 24, pad oxide layer 27 and hard mask layer 29 are formed on semiconductor substrate 20, and are then patterned. Pad oxide layer 27 may be a thin film formed of silicon oxide. In accordance with some embodiments of the present disclosure, pad oxide layer 27 is formed in a thermal oxidation process, wherein a top surface layer of semiconductor substrate 20 is oxidized. Pad oxide layer 27 acts as an adhesion layer between semiconductor substrate 20 and hard mask layer 29. Pad oxide layer 27 may also act as an etch stop layer for etching hard mask layer 29. In accordance with some embodiments of the present disclosure, hard mask layer 29 is formed of silicon nitride, for example, using Low-Pressure Chemical Vapor Deposition (LPCVD). In accordance with other embodiments of the present disclosure, hard mask layer 29 is formed by thermal nitridation of silicon, or Plasma Enhanced Chemical Vapor Deposition (PECVD). A photo resist (not shown) is formed on hard mask layer 29 and is then patterned. Hard mask layer 29 is then patterned using the patterned photo resist as an etching mask to form hard masks 29 as shown in FIG. 2.

Next, the patterned hard masks 29 are used as an etching mask to etch pad oxide layer 27 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric material(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 29 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
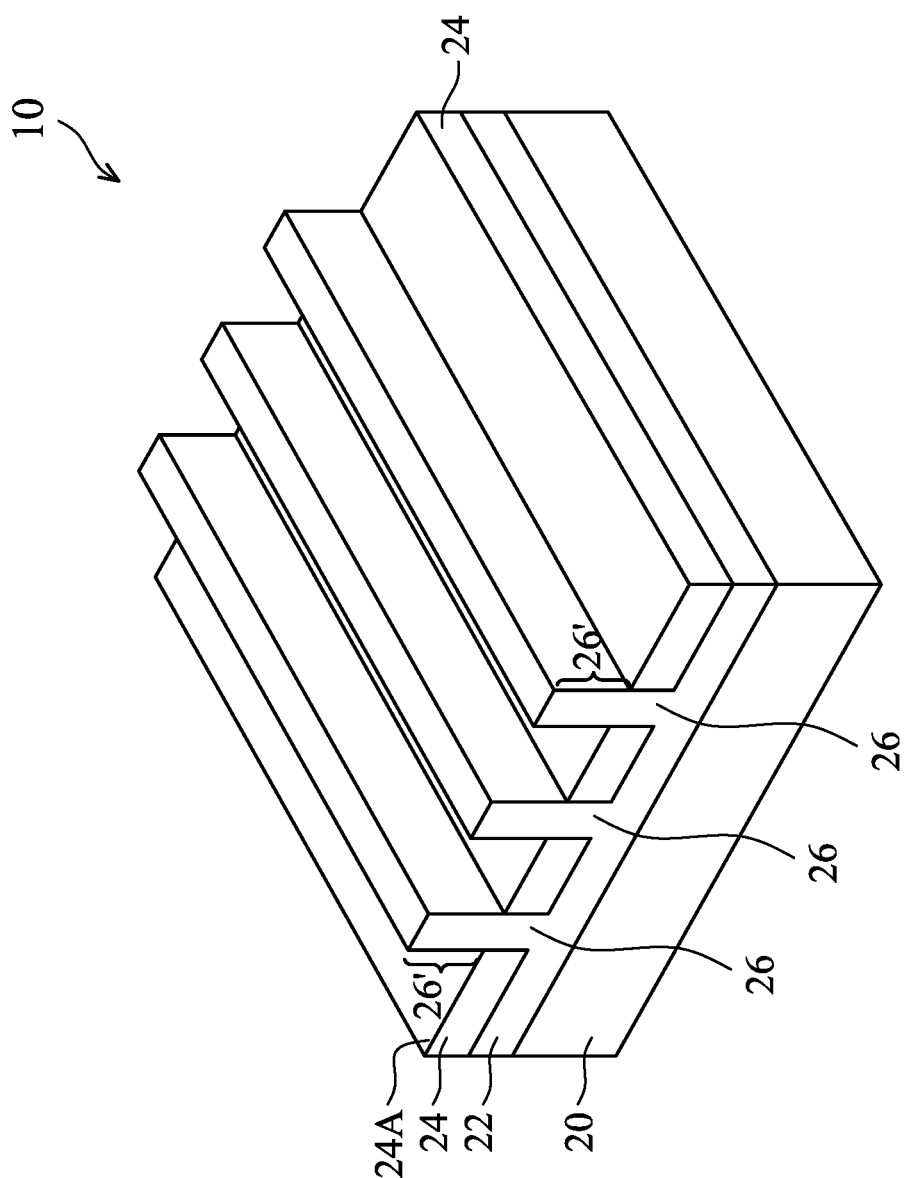

Referring to FIG. 3, STI regions 24 are recessed. The top portions of semiconductor strips 26 thus protrude higher than the top surfaces 24A of the remaining portions of STI regions 24 to form protruding fins 26'. The respective process is shown as process 206 in the process flow 200 shown in FIG. 24. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
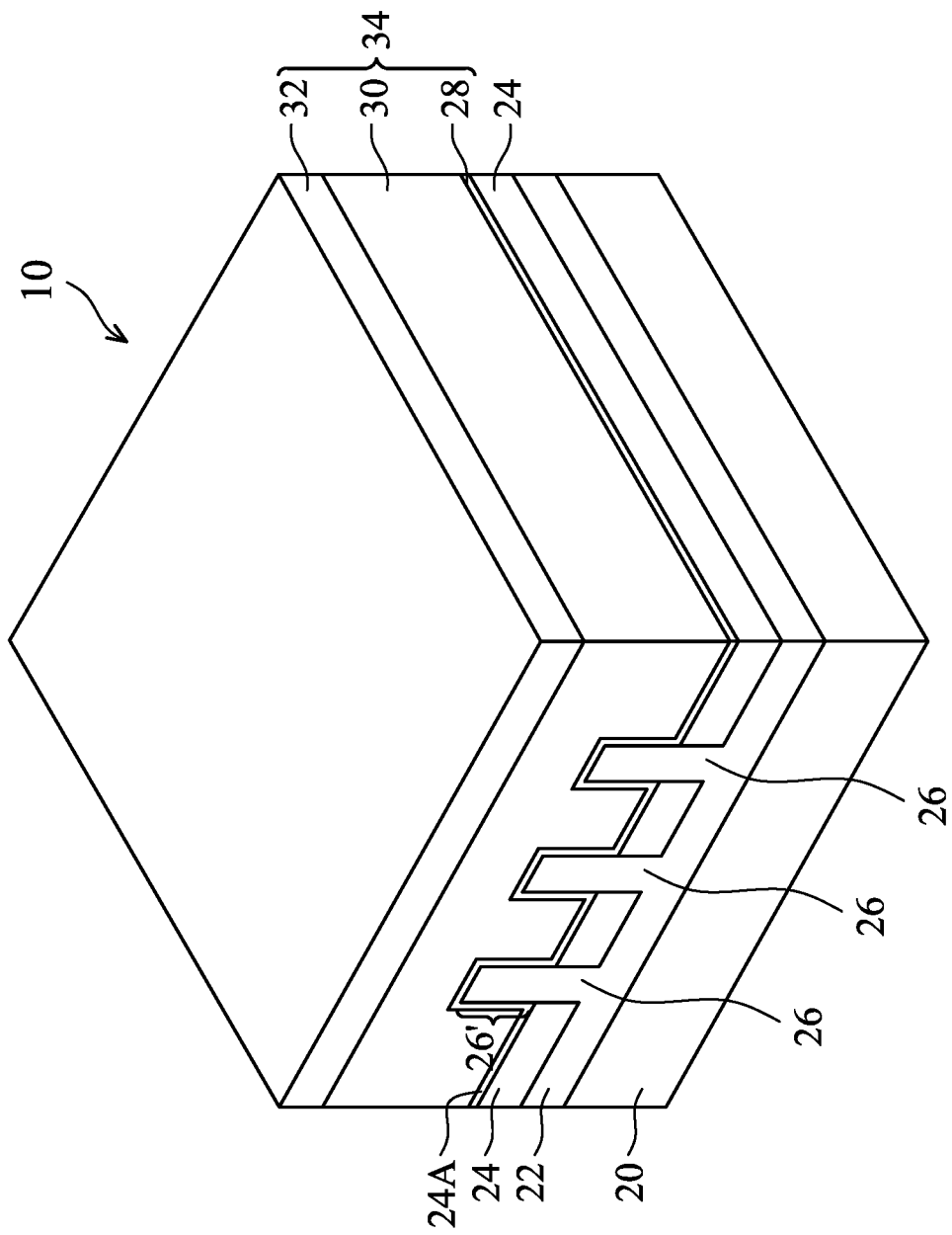

FIG. 4 illustrates the formation of dummy gate stack 34 in accordance with some embodiments, with the dummy gate stack 34 including dummy gate dielectric layer 28, dummy gate electrode layer 30, and hard mask 32. The respective process is shown as process 208 in the process flow 200 shown in FIG. 24. Dummy gate dielectric layer 28 is formed on the sidewalls and the top surfaces of protruding fins 26'. In accordance with some embodiments of the present disclosure, dummy gate dielectric layer 28 is formed using a conformal deposition process, which may include Atomic Layer Deposition (ALD), Chemical Vapor Deposition (CVD), or the like. The material of dummy gate dielectric layer 28 may include silicon oxide, silicon nitride, silicon carbo-nitride, or the like. In accordance with alternative embodiments, the formation of dummy gate dielectric layer 28 includes oxidizing (for example, using a thermal oxidation process) the surface portions of protruding fins 26'. The resulting dummy gate dielectric layer 28 includes an oxide formed on the exposed surfaces of protruding fins 26', but not on the top surfaces of STI regions 24. The formation of dummy gate dielectric layer 28 may or may not include a deposition process. Dashed lines are used to show that some portions of dummy gate dielectric layer 28 on the top of STI regions 24 may or may not be formed, depending on the formation process.

Dummy gate electrode layer 30 is deposited on dummy gate dielectric layer 28. Dummy gate electrode layer 30 may be formed of or comprise polysilicon or amorphous silicon, and other materials may also be used. The formation process may include a deposition process followed by a planarization process. Hard mask layer 32 is then deposited on dummy gate electrode layer 30. Hard mask layer 32 may be formed of or comprise silicon nitride, silicon oxide, silicon oxy-carbo-nitride, or multi-layers thereof.

Figure 5A:
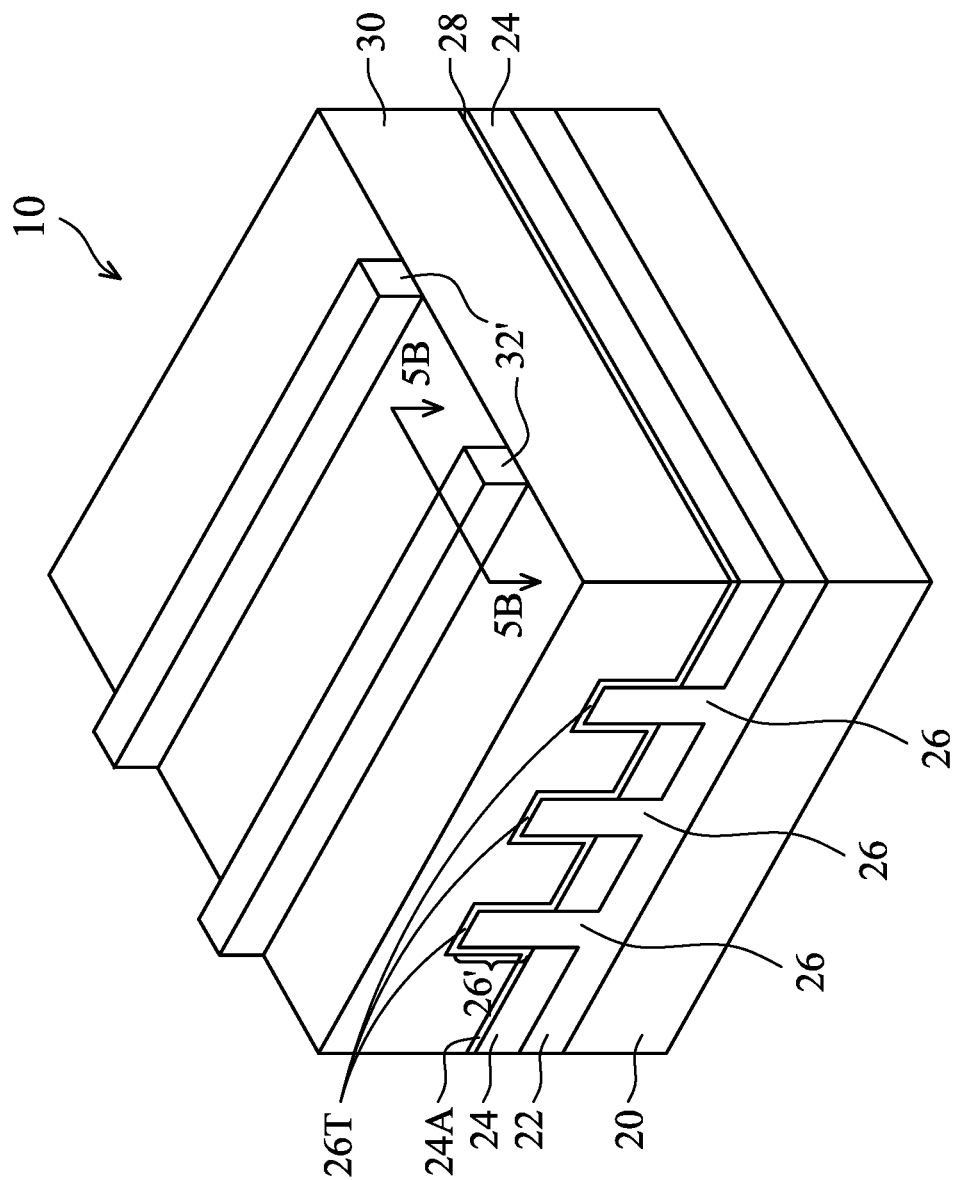
Figure 5B:
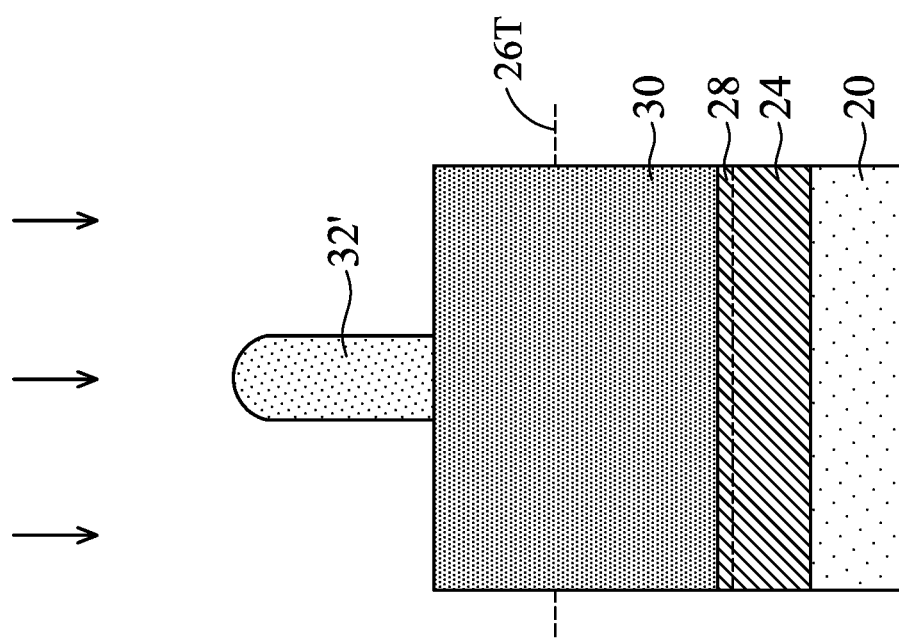

Next, referring to FIG. 5A, hard mask layer 32 is patterned, for example, etched by using a patterned photo resist (not shown) as an etching mask, hence forming hard masks 32'. The respective process is shown as process 210 in the process flow 200 shown in FIG. 24. FIG. 5B illustrates the reference vertical cross-section 5B-5B as shown in FIG. 5A. In FIGS. 5A, 5B and subsequent figures, the level of the top surface 26T of protruding fins 26' is illustrated. Also, dummy gate dielectric layer 28 is formed of or includes a dielectric material, which may be (or may not be) the same material as that of STI regions 24. Accordingly, dummy gate dielectric layer 28 is shown in FIG. 5B, but may not be illustrated separately in subsequent figures. Accordingly, the top surface portion of the illustrated STI region 24 in subsequent figures may be considered as being the dummy gate dielectric layer 28.

Figure 6:
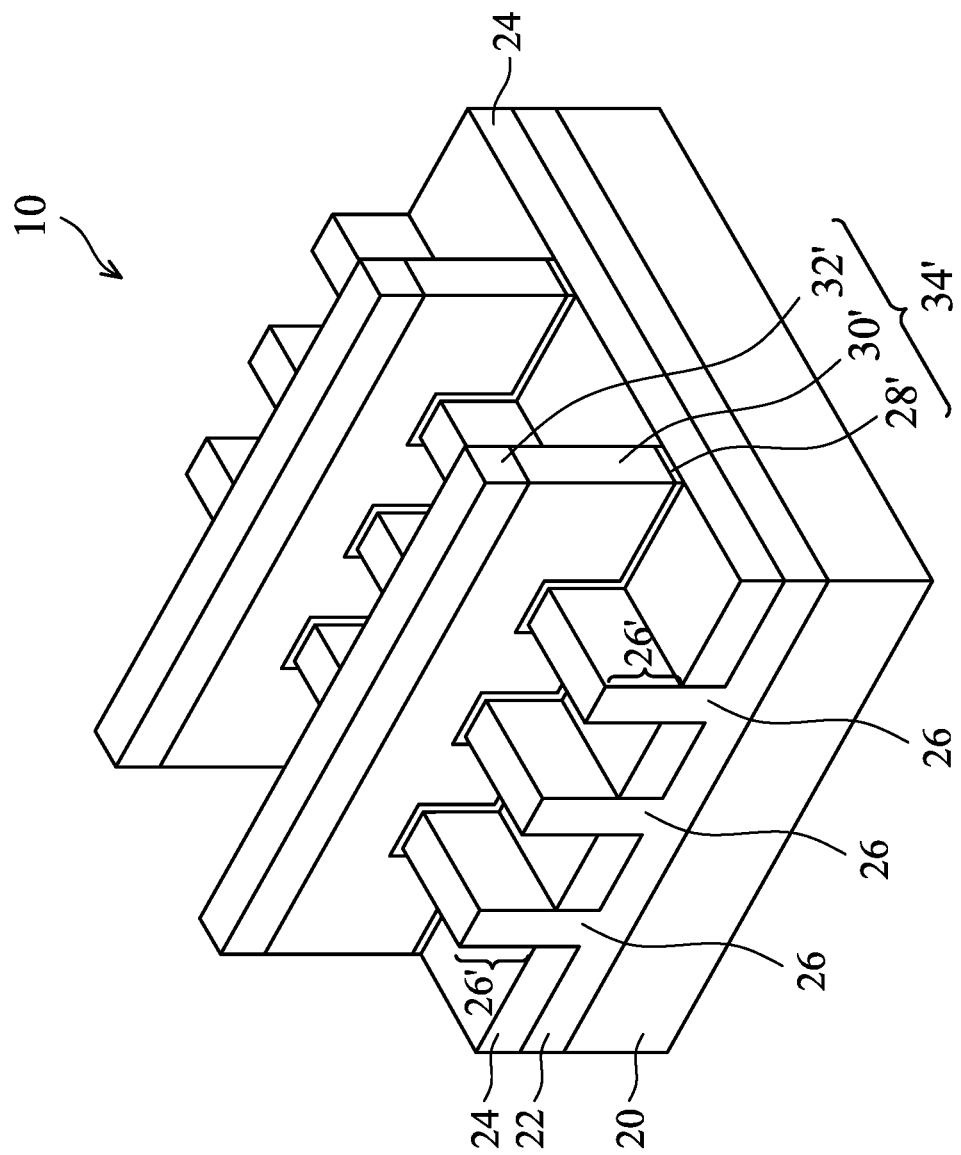

In subsequent processes, dummy gate electrode layer 30 and possibly dummy gate dielectric layer 28 are patterned, with hard mask strips 32' being used as an etching mask. The dummy gate electrodes 30' are thus formed, as shown in FIG. 6. Dummy gate stacks 34' may have lower portions (also referred to as narrowing portions) narrower and more tapered than the upper portions, and the details of dummy gate electrodes 30' are shown in FIG. 6E.

Figure 6A:
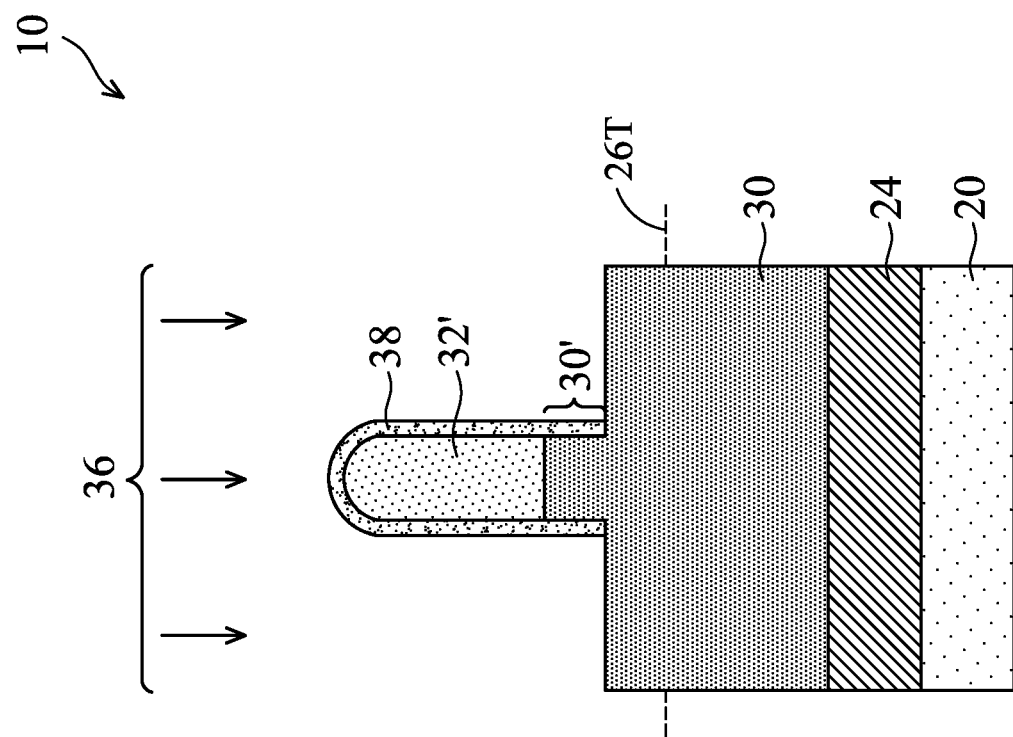
Figure 6B:
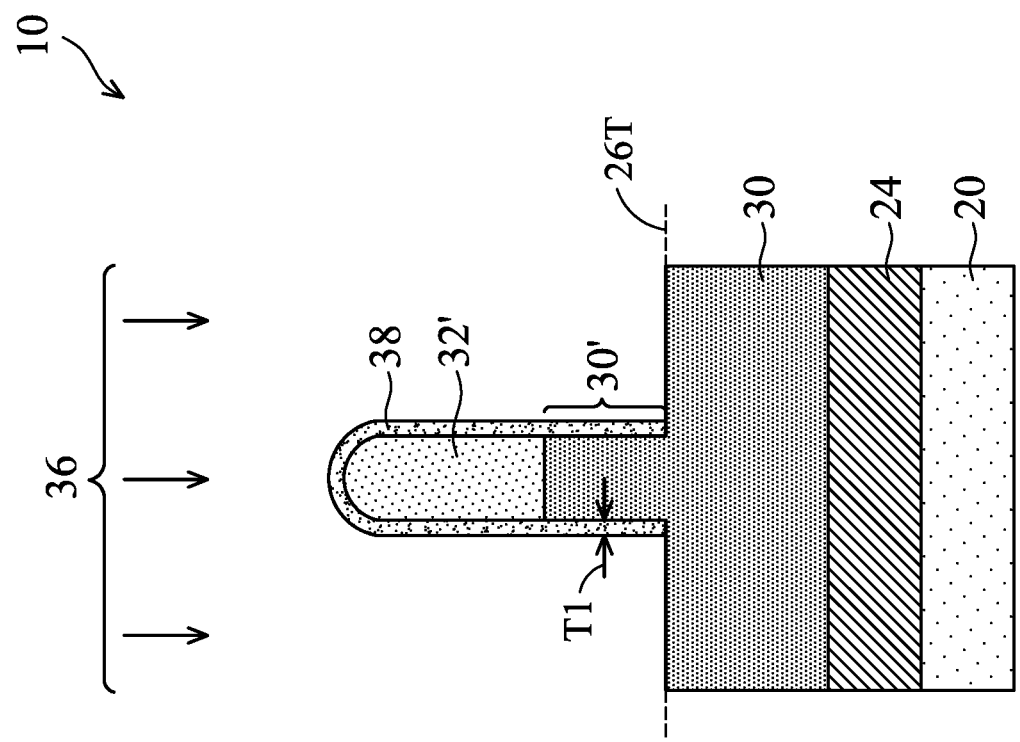
Figure 6C:
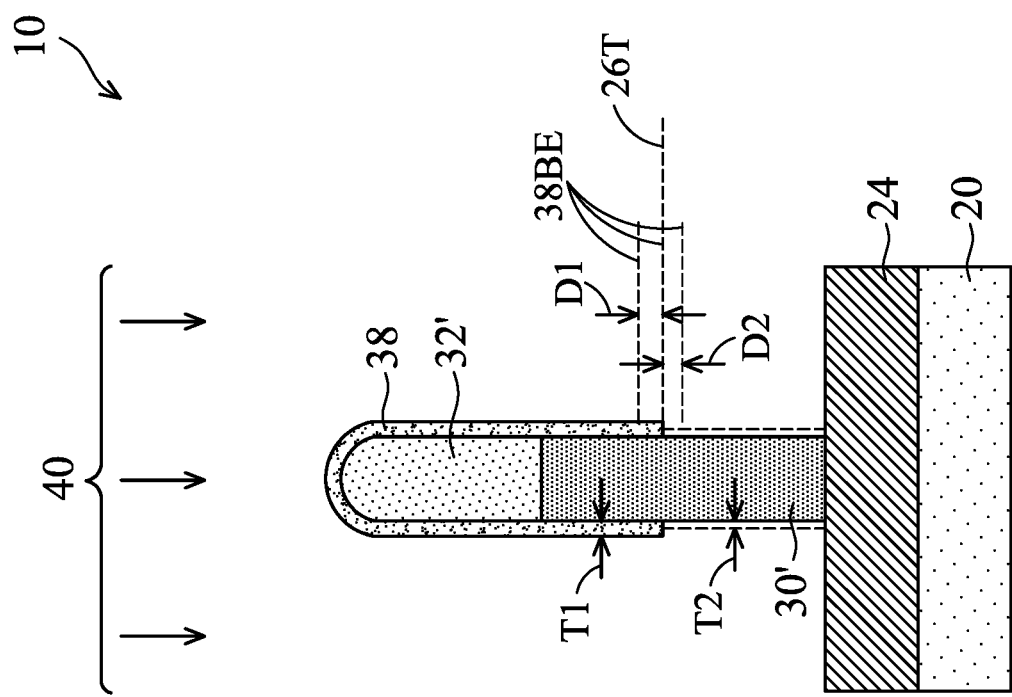
Figure 6D:
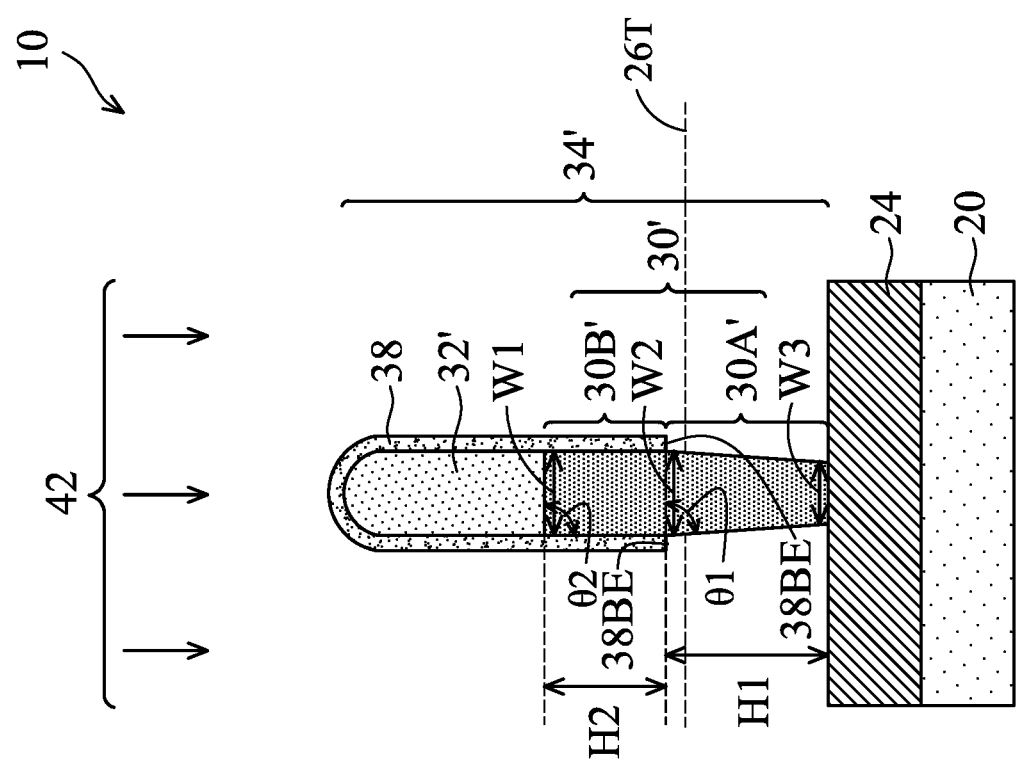
Figure 6E:
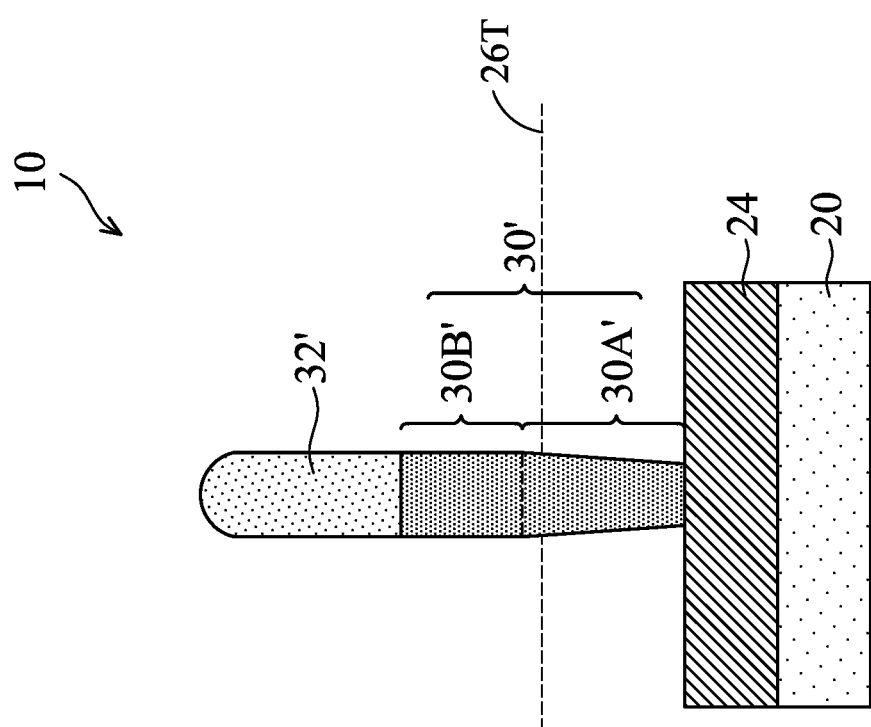

FIGS. 6A, 6B, 6C, 6D, and 6E illustrate the intermediate stages in the patterning of dummy gate electrode layer 30 in accordance with some embodiments. Referring to FIG. 6A, a first etching process 36, which is anisotropic etching process, is performed using hard masks 32' as an etching mask. In accordance with some embodiments, the process gas includes both of an etching gas and a byproduct-generating gas. The etching gas may include $Cl_2$, HBr, $CF_4$, $CHF_3$, $CH_2F_2$, $CH_3F$, $C_4F_6$, or combinations thereof. The byproduct-generating gas may include nitrogen ($N_2$), oxygen ($O_2$), $SO_2$, $CO_2$, CO, or combinations thereof. Other gases such as Ar, He, Ne, or the like, may also be added into the process gas. In accordance with some embodiments of the present disclosure, the etching process is performed with a source power in a range between about 10 watts and about 3,000 watts. The bias power is higher than about 200 watts, and may be in the range between about 10 watts and about 3,000 watts. The pressure of the process gas may be in the range between about 1 mTorr and about 800 mTorr. The flow rate of the process gas may be in the range between about 1 sccm and about 5,000 sccm.

Figure 6F:
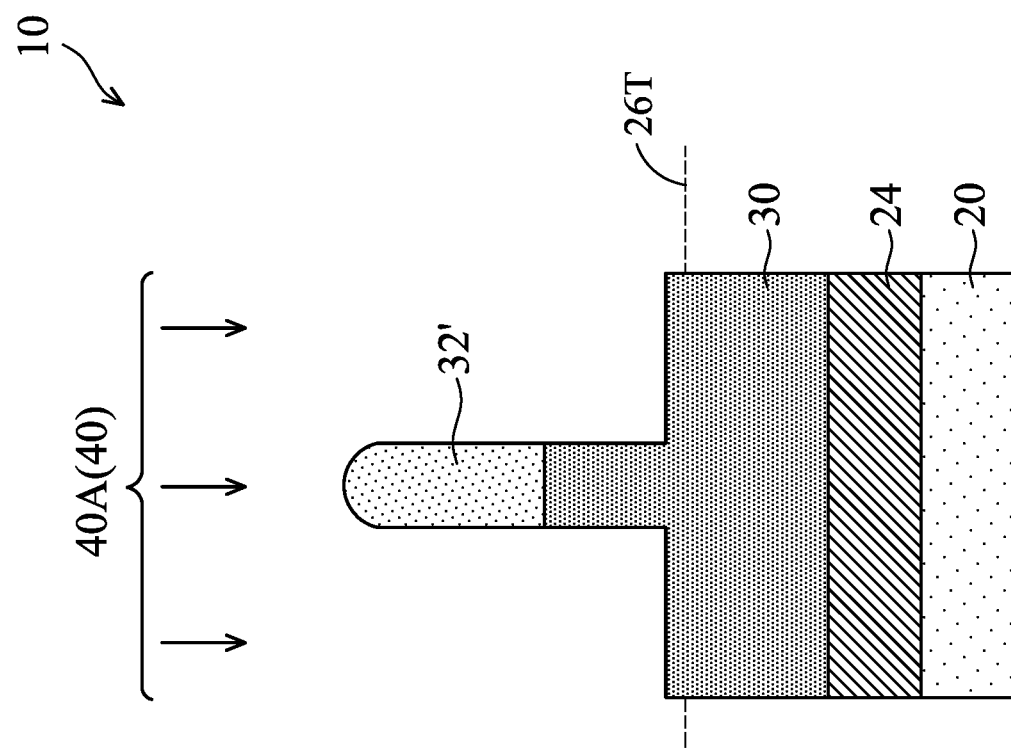
FIGS. 6F, 6G, 6H, and 6I are cross-sectional views of intermediate stages in the formation of a dummy gate electrode with more than one narrowing sections in accordance with some embodiments of the present disclosure.

In the etching process 36, the surface layer of the formed dummy gate electrodes 30' reacts with the byproduct-generating gas to form byproduct layer 38, which includes portions on the sidewalls of the newly formed portions of dummy gate electrodes 30'. The respective process is shown as process 212 in the process flow 200 shown in FIG. 24. Byproduct layer 38 may (or may not, as shown in FIG. 6F) be formed on the surfaces of hard masks 32', depending on the composition of hard masks 32'. The byproduct layer 38 may include $Si_wO_xN_yC_z$, $SiBr_aCl_bO_c$, or the like, depending on the process gas. In order to generate byproduct layer 38, and to make byproduct layer 38 to be thick enough as an etching mask in the subsequent process, more byproduct-generating gas is introduced. For example, the ratio of the flow rate of the byproduct-generating gas to the flow rate of the etching gas may be higher than about 40, and may be in the range between about 1 and about 1,000. With the proceeding of the etching process 36, the byproduct layer 38 extends down, as shown by FIG. 6B. The thickness T1 of byproduct layer 38 may be in the range between about 2 Å and about 300 Å. In etching process 36, plasma is turned on. The temperature of the respective wafer may be in the range between about 0° C. and about 150° C.

In accordance with some embodiments, after the etching process 36, the etching gas is stopped, and the byproduct-generating gas is conducted to increase the thickness of byproduct layer 38. The respective byproduct-generating gas may include $N_2$, $O_2$, $SO_2$, $CO_2$, CO, $SiCl_4$, or the like, or combinations thereof. In this process, plasma may be turned on. The respective process is referred to as a byproduct-thickening process. In accordance with some embodiments, the byproduct-thickening process is performed in-situ with (in the same process chamber as) the etching process 36 (and the subsequently performed etching process 40 (FIG. 6C)), and there is no vacuum break between these processes. In accordance with alternative embodiments, the byproduct-thickening process is performed ex-situ with processes 36 and 40, with vacuum break therebetween. The ex-situ byproduct-thickening process may be performed using $N_2$, $O_2$, $SO_2$, $CO_2$, CO, or the like, or combinations thereof as process gases.

In accordance with alternative embodiments, the byproduct-thickening process is performed using a chemical solution, which may include ozone and/or $CO_2$ dissolved in de-ionized water, with wafer 10 being dipped in the chemical solution for the byproduct layer 38 to form.

Figure 6G:
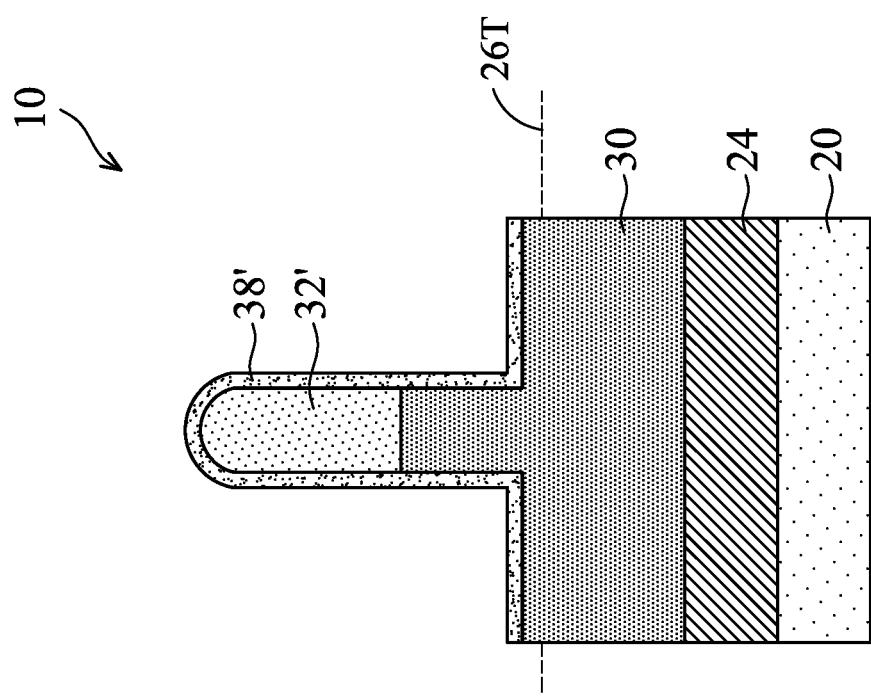
Figure 6H:
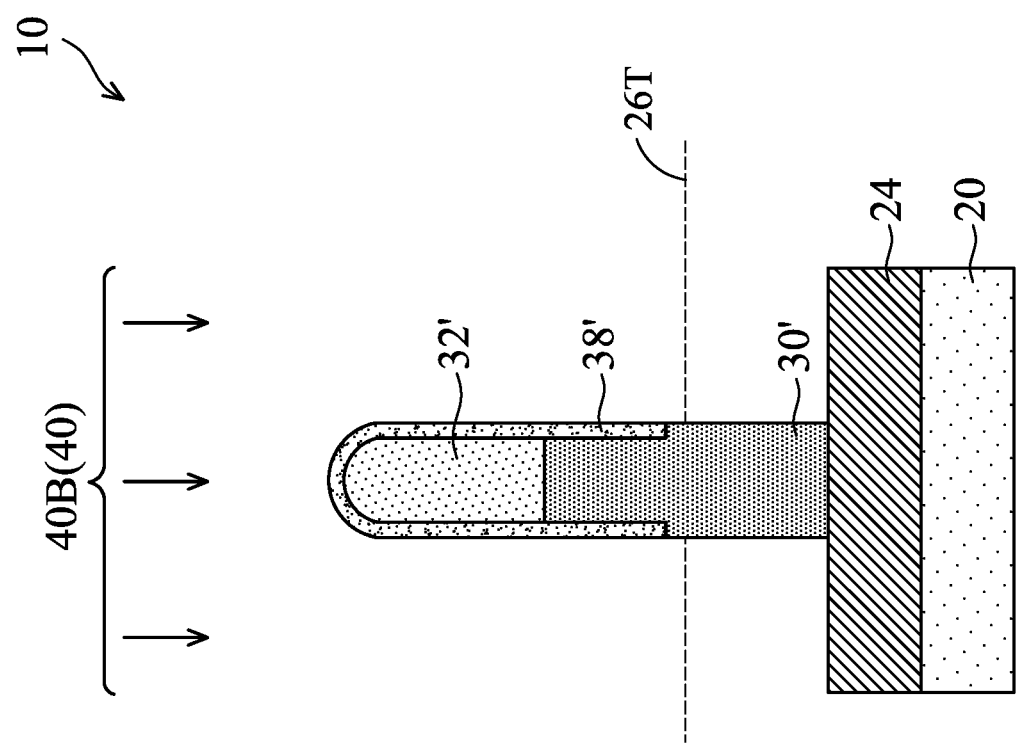

In accordance with yet alternative embodiments, in etching process 36, the process gas includes the etching gas, and is free from the byproduct-generating gas. Accordingly, in etching process 36, no byproduct layer is generated. The byproduct layer 38 is generated by a byproduct-thickening process, which may include the in-situ, ex-situ, or the wet process as aforementioned. In accordance with some embodiments, in the in-situ, ex-situ, or the wet process, byproduct layer 38 is also formed on the exposed horizontal surface of the un-etched portion of dummy gate electrode layer 30, similar to the protection layer 38' as shown in FIG. 6G. In accordance with other embodiments, in some in-situ or ex-situ processes, byproduct layer 38 is formed (or thickened) on the sidewalls, but not on the horizontal surface of the un-etched portion of dummy gate electrode layer 30.

Referring to FIG. 6C, after the first etching process 36 is performed, a second anisotropic etching process 40 is performed to further etch dummy gate electrode layer 30, until dummy gate electrode layer 30 is etched-through to generate dummy gate electrode 30'. The respective process is shown as process 214 in the process flow 200 shown in FIG. 24. In etching process 40, plasma is turned on. Dummy gate dielectric layer 28 may then be patterned, or may not be patterned at this time. The second etching process 40 is performed using an etching gas, which may include $Cl_2$, HBr, $CF_4$, $CHF_3$, $CH_2F_2$, $CH_3F$, $C_4F_6$, or combinations thereof. In accordance with some embodiments, the process gas is free from any byproduct-generating gas, which may include $N_2$, $O_2$, $SO_2$, $CO_2$, CO, or the like. In accordance with alternative embodiments, the process gas includes one or more of the byproduct-generating gas. The flow rate of the byproduct-generating gas, however, is reduced compared to the etching process 36. If the flow rates of the byproduct-generating gas in etching processes 36 and 40 are denoted as being $BPFR_{36}$ and $BPFR_{40}$, respectively, the ratio $BPFR_{40}/BPFR_{36}$ may be smaller than about 0.2 or 0.1, and may be in the range between about 0 and about 0.2 or 0.1. On the other hand, the flow rates of the etching gases in etching processes 36 and 40 may be equal to each other, or may be different from each other. Accordingly, substantially no new byproduct layer is generated in etching process 40, or although there is byproduct layer 38 generated by etching process 40, the thickness T2 of the newly generated byproduct layer 38 is smaller than thickness T1. For example, in FIG. 6C, dashed lines are used to illustrate the byproduct layer 38 generated in etching process 40, which byproduct layer 38 has thickness T2. In accordance with some embodiments, ratio T2/T1 is smaller than about 0.2 or 0.1, and may be in the range between 0 and about 0.2 or 0.1.

FIG. 6C illustrates several embodiments, wherein several possible positions of the bottom end 38BE of byproduct layer 38 are illustrated. The level of the top surfaces 26T of protruding fins 26' is also shown. In various embodiments, the bottom end 38BE may be higher than, level with, or lower than, the top surfaces 26T of protruding fins 26'. For example, the bottom end 38BE of byproduct layer 38 may be higher than fin top surface 26T by height difference D1, which may be in the range between 0 nm and about 50 nm. The bottom end 38BE of byproduct layer 38 may be lower than fin top surface 26T by height difference D2, which may be in the range between 0 nm and about 100 nm.

Referring to FIG. 6D, after the formation of dummy gate electrode 30', etching process 42 is performed, which process is also referred to as a reshaping process of the dummy gate electrode 30'. The respective process is shown as process 216 in the process flow 200 shown in FIG. 24. In accordance with some embodiments, the etching process 42 is performed using a process gas that can etch dummy gate electrode 30', which process gas may be selected from $Cl_2$, HBr, $CF_4$, $CHF_3$, $CH_2F_2$, $CH_3F$, $C_4F_6$, or combinations. The process gas may be free from the byproduct-generating gases such as $N_2$, $O_2$, $SO_2$, $CO_2$, CO, or the like, or may include a small amount of byproduct-generating gas to tune the etching process. Accordingly, no byproduct layer is further generated. The etching process 42 may be performed using a source power in a range between about 10 watts and about 3,000 watts. The pressure of the process gas may be in the range between about 1 mTorr and about 800 mTorr. The flow rate of the process gas may be in the range between about 1 sccm and about 5,000 sccm. The bias power is reduced compared to what are used in processes 36 and 40, so that the etching process 42, besides the anisotropic effect, also has some isotropic effect. The bias power may smaller than about 40 percent, and may be between about 5 percent and about 80 percent of the bias power used in etching processes 36 and 40. In accordance with some embodiments, the bias power used in etching process 42 may be lower than about 100 watts, and may be in the range between about 10 watts and about 3,000 watts.

As a result of the etching process 42, dummy gate electrode 30' is reshaped, and the resulting structure is shown in FIG. 6D in accordance with some embodiments. Dummy gate stack 34' is thus formed, which may include the patterned dummy gate dielectric 28' (FIG. 7) when it is patterned, or not include dummy gate dielectric 28' if it is not patterned. In the etching process 42, byproduct layer 38 partially protects the lower portion 30A' of dummy gate electrode 30', which lower portion is lower than the bottom ends 38BE of byproduct layer 38. Accordingly, byproduct layer 38 is alternatively referred to as a protection layer. Since etching process 42 also has isotropic effect, there is also lateral etching on the lower portion 30A' of dummy gate electrode 30'. The upper parts of the lower portion 30A' are protected more, and the lateral etching is less significant. The lower parts of the lower portion 30A' are protected less, and the lateral etching is more significant. As a result, the lower portion 30A' is tapered. Throughout the description, lower portion 30A' is also referred to as a narrowing portion.

In accordance with some embodiments, lower portion 30A' has slanted and straight sidewalls. The top width W2 is greater than bottom width W3. In accordance with some embodiment, the difference (W2−W3) is greater than about 3 Å. The height H1 of the lower portion 30A' may be greater than about 300 Å. The tilt angle θ1 of the sidewalls of the lower portion 30A' is smaller than 90 degrees, and may be smaller than about 88 degrees, or in the range between about 80 degrees and about 88 degrees.

Upper portion 30B' (having a top width W1) has sidewalls that may be straight, and are more vertical than lower portion 30A', with the tilt angle θ2 being greater than θ1. In accordance with some embodiments, the tilt angle θ2 is equal to or smaller than 90 degrees. The difference (θ2−θ1) is greater than about 2 degrees, about 5 degrees, or about 10 degrees, and may be in the range between about 1 degree and about 30 degrees. Height H2 of the upper portion 30B' may be greater than about 40 nm, and may be in the range between about 10 nm and about 200 nm.

Figure 7:
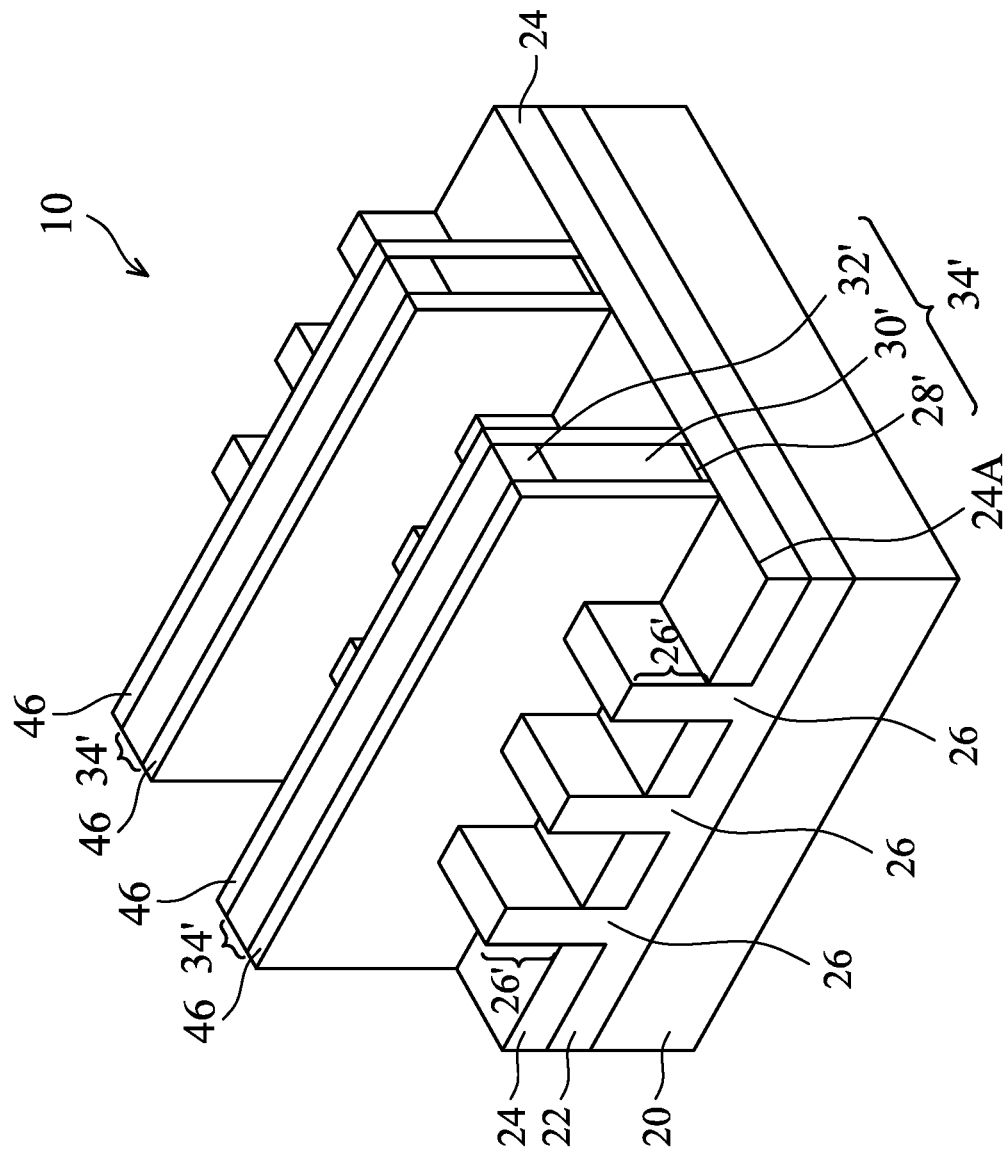
Figure 8:
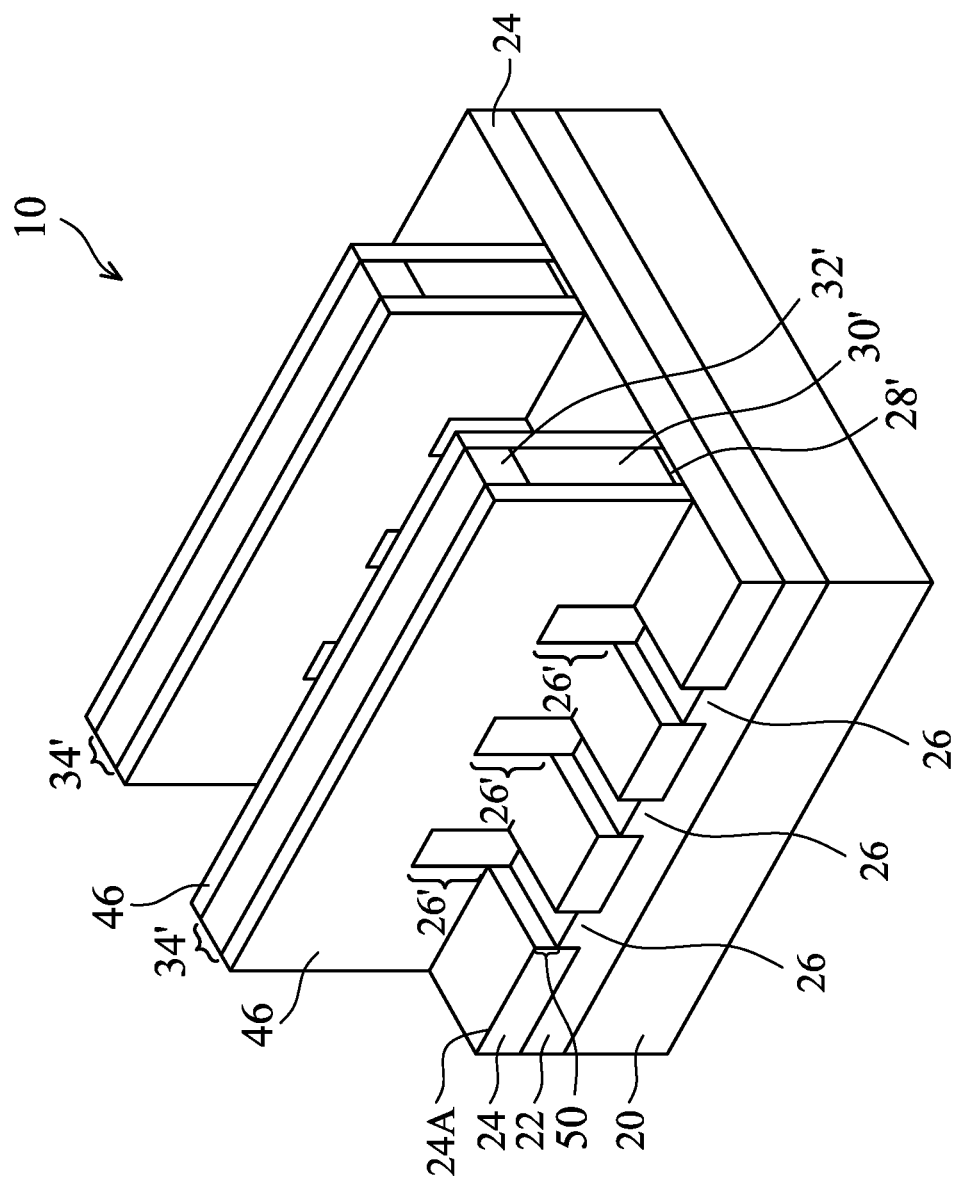

After the etching process 42, the byproduct layer 38 is removed, for example, in an etching process. The respective process is shown as process 218 in the process flow 200 shown in FIG. 24. The resulting structure is shown in FIG. 6E. Next, as shown in FIG. 7, gate spacers 46 are formed on the sidewalls of dummy gate stacks 34'. The respective process is shown as process 220 in the process flow 200 shown in FIG. 24. In accordance with some embodiments of the present disclosure, gate spacers 46 are formed of a dielectric material(s) such as silicon nitride, silicon carbonitride, or the like, and may have a single-layer structure or a multi-layer structure including a plurality of dielectric layers.

An etching process is then performed. The portions of protruding fins 26' that are not covered by dummy gate stacks 34' and gate spacers 46 are etched, resulting in the structure shown in FIG. 8. The respective process is shown as process 222 in the process flow 200 shown in FIG. 24. The etching process may be anisotropic, and hence the portions of protruding fins 26' directly underlying dummy gate stacks 34' and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 include some portions located on the opposite sides of dummy gate stacks 34', and some portions between remaining portions of protruding fins 26'.

Figure 9:
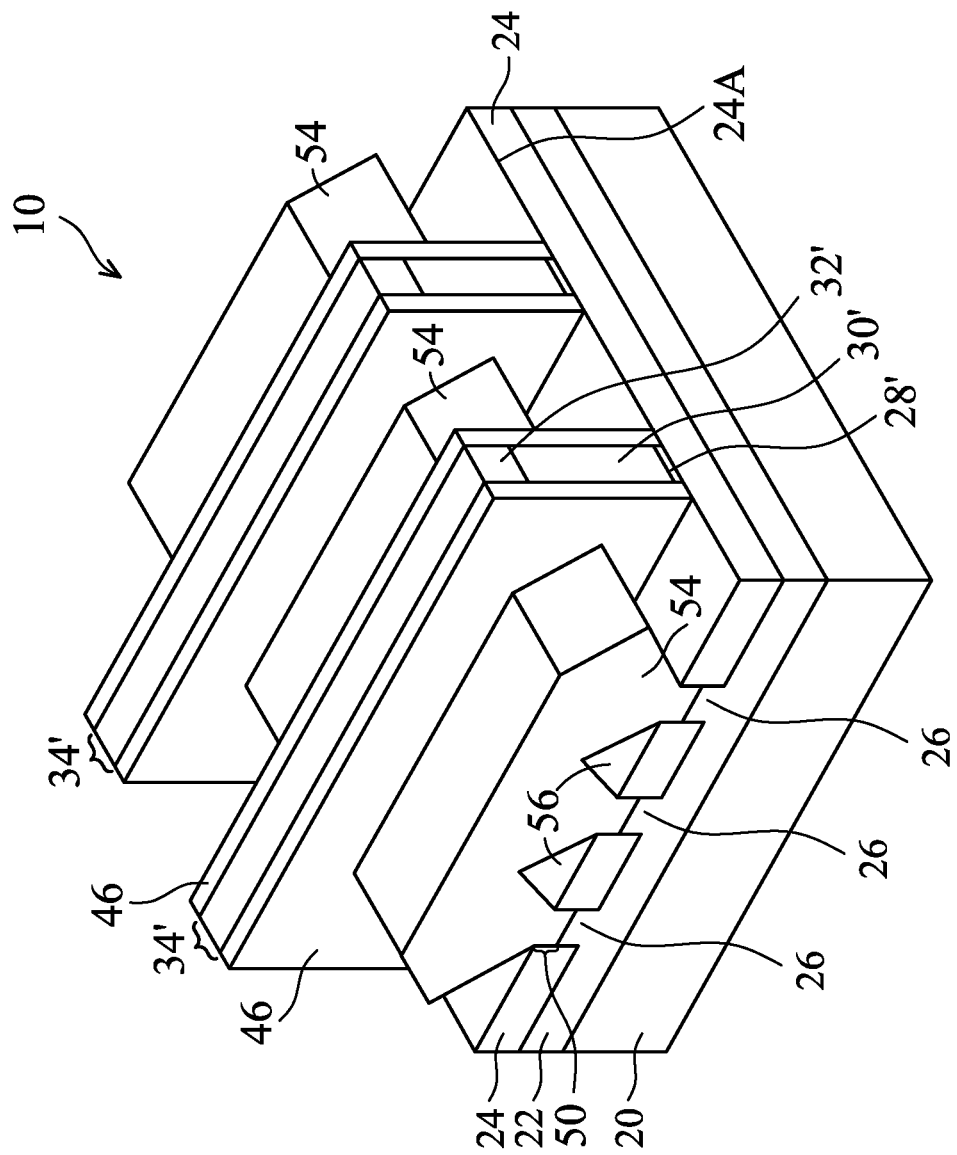

Next, epitaxy regions (source/drain regions) 54 are formed by selectively growing (through epitaxy) a semiconductor material in recesses 50, resulting in the structure in FIG. 9. The respective process is shown as process 224 in the process flow 200 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 10:
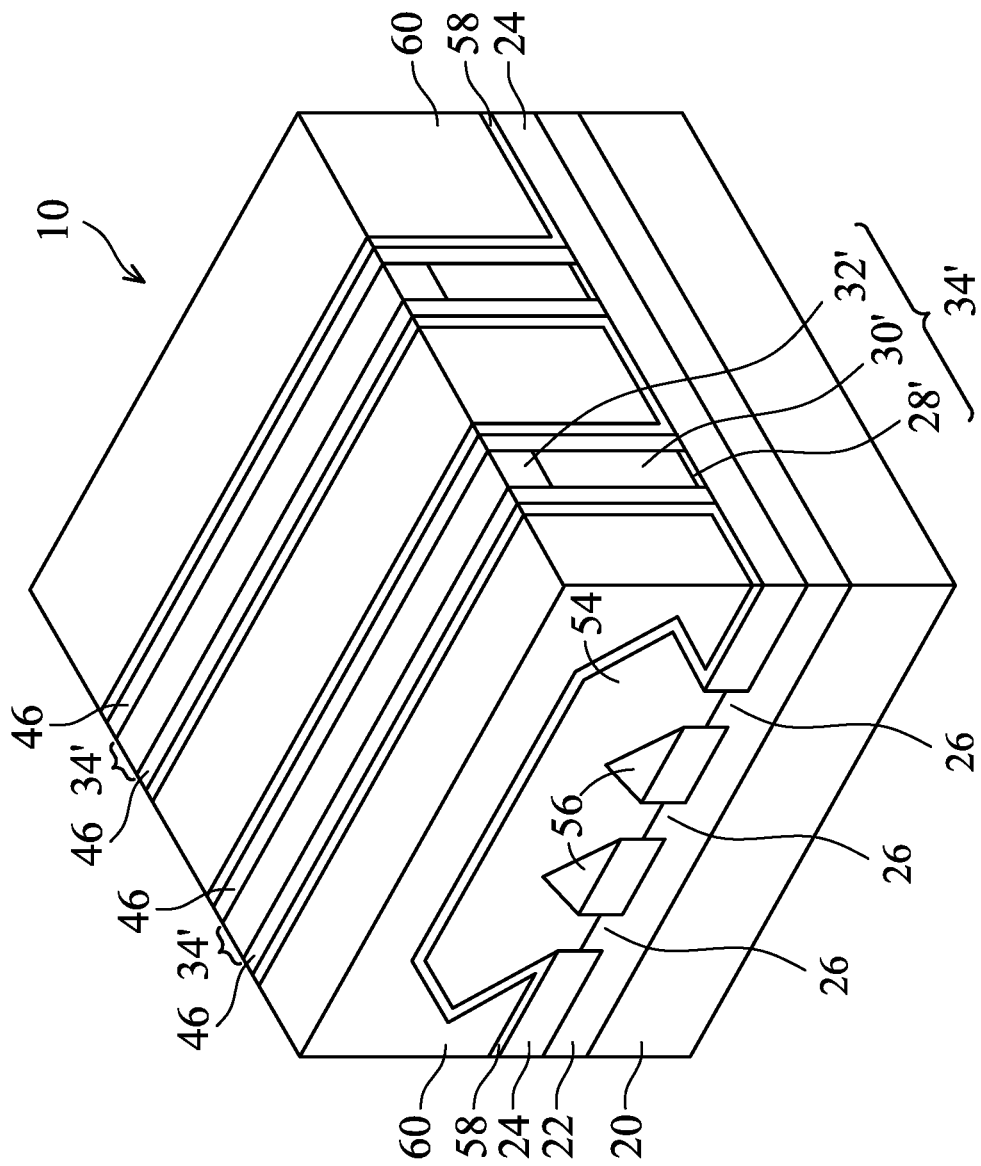

FIG. 10 illustrates a perspective view of the structure after the formation of Contact Etch Stop Layer (CESL) 58 and Inter-Layer Dielectric (ILD) 60. The respective process is shown as process 226 in the process flow 200 shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 34', and gate spacers 46 with each other.

Figure 11A:
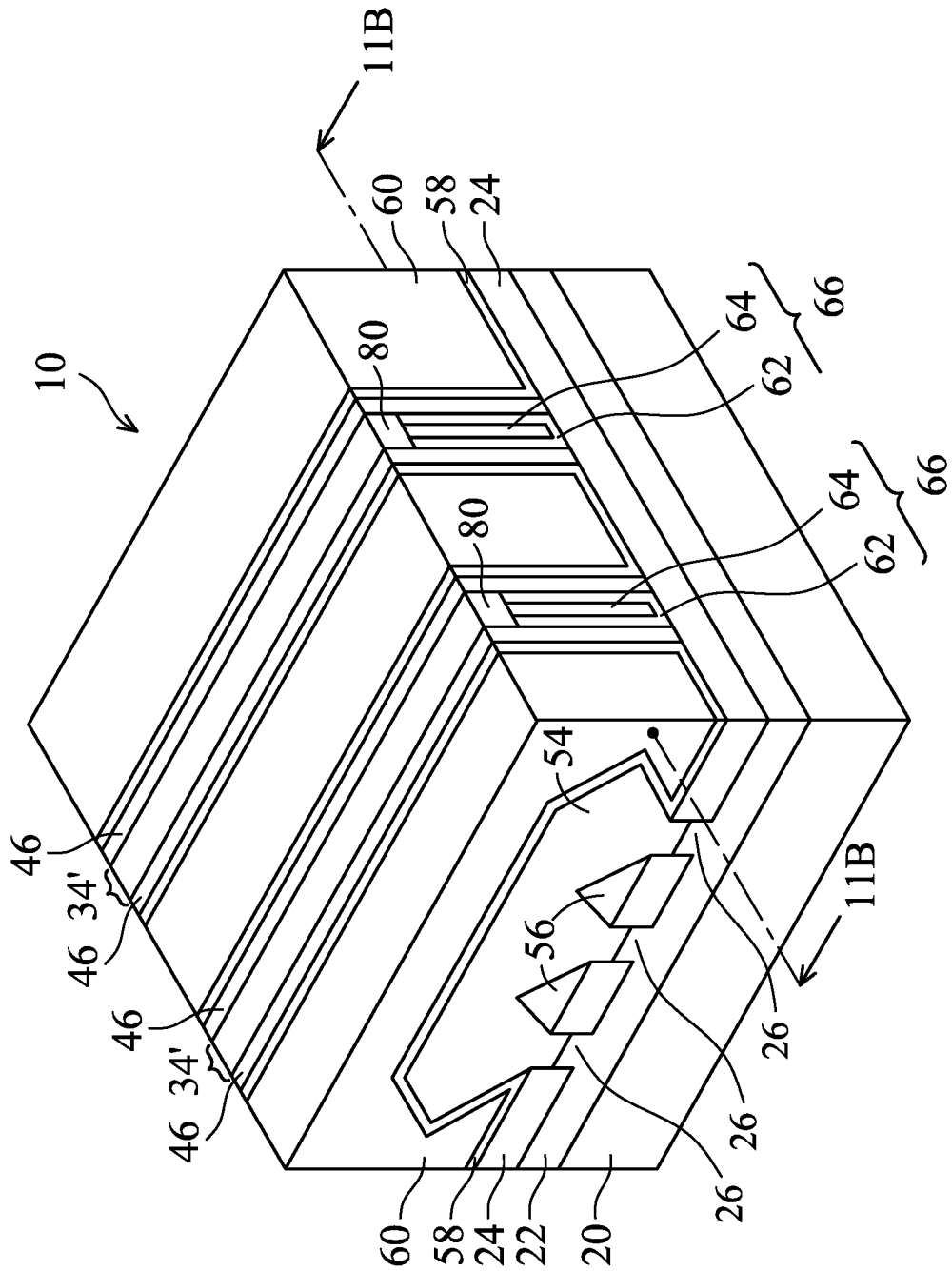

Dummy gate stacks 34' are then removed. The portions of dummy gate dielectric layer on protruding fins 26' are also removed to expose protruding fins 26'. Replacement gate stacks 66 and self-aligned hard masks 80 are formed in the resulting trenches. The resulting structure is shown in FIG. 11A. The respective process is shown as process 228 in the process flow 200 shown in FIG. 24. Gate stack 66 includes gate dielectric 62 and gate electrode 64. Gate dielectric 62 may include an Interfacial Layer (IL) (not shown) and a high-k dielectric layer. The IL is formed on the exposed surfaces of protruding fins 26', and may include an oxide layer such as a silicon oxide layer, which is formed through the thermal oxidation of protruding fins 26', a chemical oxidation process, or a deposition process. The high-k dielectric layer includes a high-k dielectric material such as hafnium oxide, lanthanum oxide, aluminum oxide, zirconium oxide, or the like.

Referring further to FIG. 11A, gate electrode 64 is formed on gate dielectric 62. Gate electrode 64 may include stacked layers, which may include a diffusion barrier layer (a capping layer), and one or more work-function layer over the diffusion barrier layer. The diffusion barrier layer may be formed of titanium nitride, which may (or may not) be doped with silicon, titanium silicon nitride, or the like. The work-function layer determines the work-function of the gate electrode, and includes at least one layer, or a plurality of layers formed of different materials. Gate electrode 64 may also include a metal-filling region, which may be formed of or comprise cobalt, tungsten, alloys thereof, or other metals or metal alloys.

Next, a planarization process such as a Chemical Mechanical Polish (CMP) process or a mechanical grinding process is performed, so that the top surface of gate stack 66 is coplanar with the top surface of ILD 60. In a subsequent process, gate stack 66 is etched back, resulting in a recess formed between opposite gate spacers 46. Next, hard masks 80 are formed over replacement gate stacks 66. In accordance with some embodiments of the present disclosure, the formation of hard masks 80 includes a deposition process to form a blanket dielectric material, and a planarization process to remove the excess dielectric material over gate spacers 46 and ILD 60. Hard masks 80 may be formed of silicon nitride, for example, or other like dielectric materials. FinFET 81 is thus formed.

FIGS. 11B-1, 11B-2, and 11B-3 illustrate the cross-sectional views of replacement gate stacks 66 in accordance with some embodiments, wherein the cross-sectional views are obtained from the reference cross-section 11B-11B in FIG. 11A. The positions of the top surfaces 26T and the bottom ends 26B of protruding fins 26' are also marked, and protruding fins 26' will extend between the top surfaces 26T and the bottom ends 26B, although protruding fins 26' are not shown since they are in a different plane than the illustrated plane. Lower portions 66A' of replacement gate stacks 66 replace, and hence have the same profile as, the lower portions 30A' of dummy gate stacks electrodes 30' in FIG. 6D. As a result, the lower portions 30A' are tapered. Throughout the description, lower portions 66A' are also referred to as narrowing portions. Upper portions 66B' of replacement gate stacks 66 replace, and hence have the same profile as, the upper portions 30B' of dummy gate stacks electrodes 30' in FIG. 6D. Accordingly, the tilt angles θ1 and θ2 are the same as discussed referring to FIG. 6D, and the details are not repeated herein. Also, the sidewall profiles of replacement gate stacks 66 will follow the sidewall profiles of dummy gate electrodes 30' in FIG. 6D.

Figures 1, 11B:
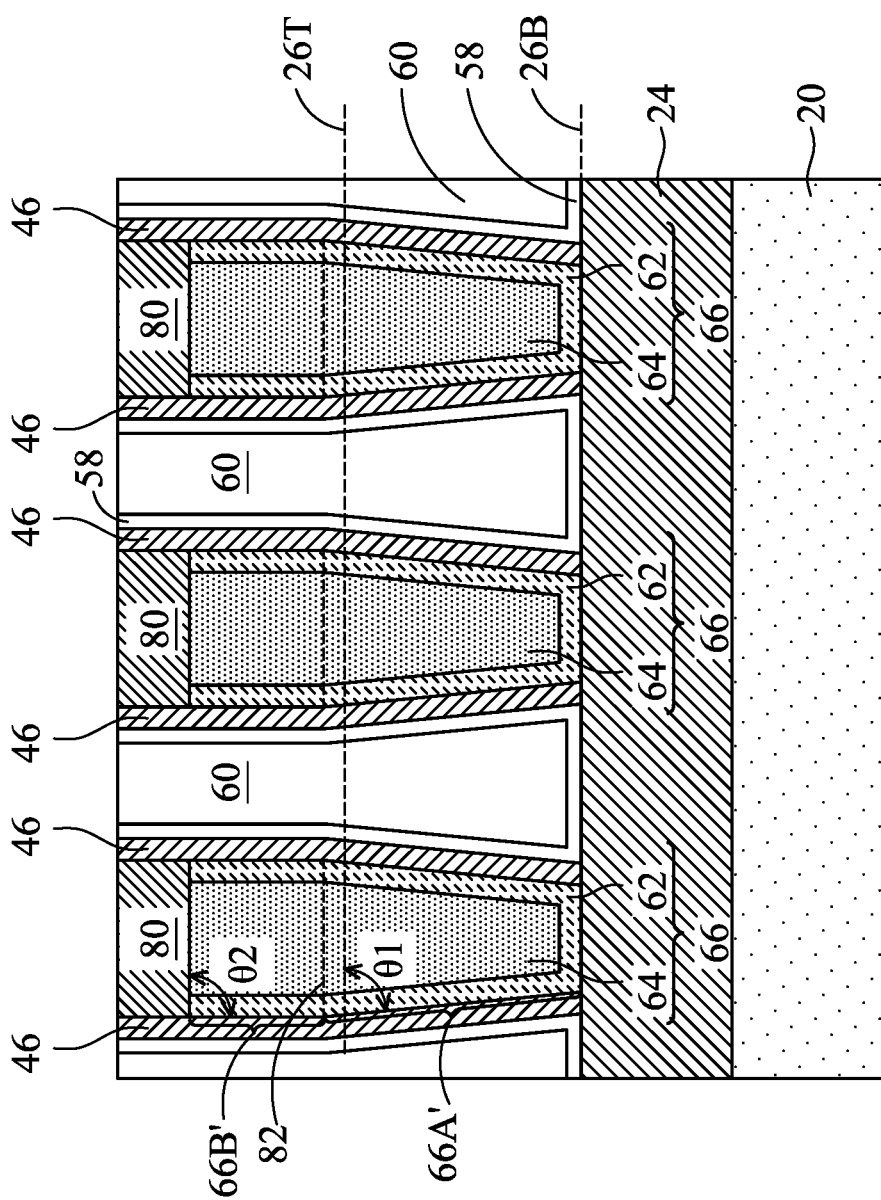
Figures 2, 11B:
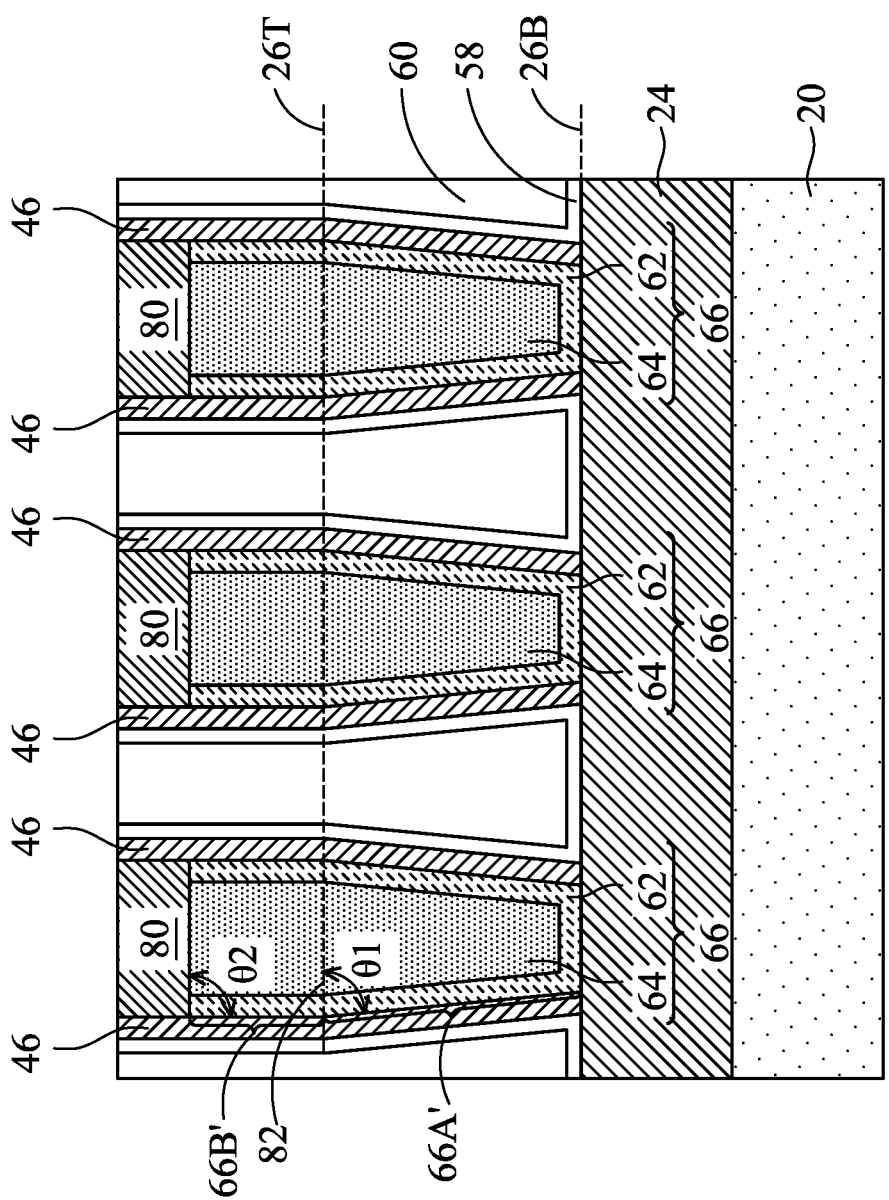
Figures 3, 11B:
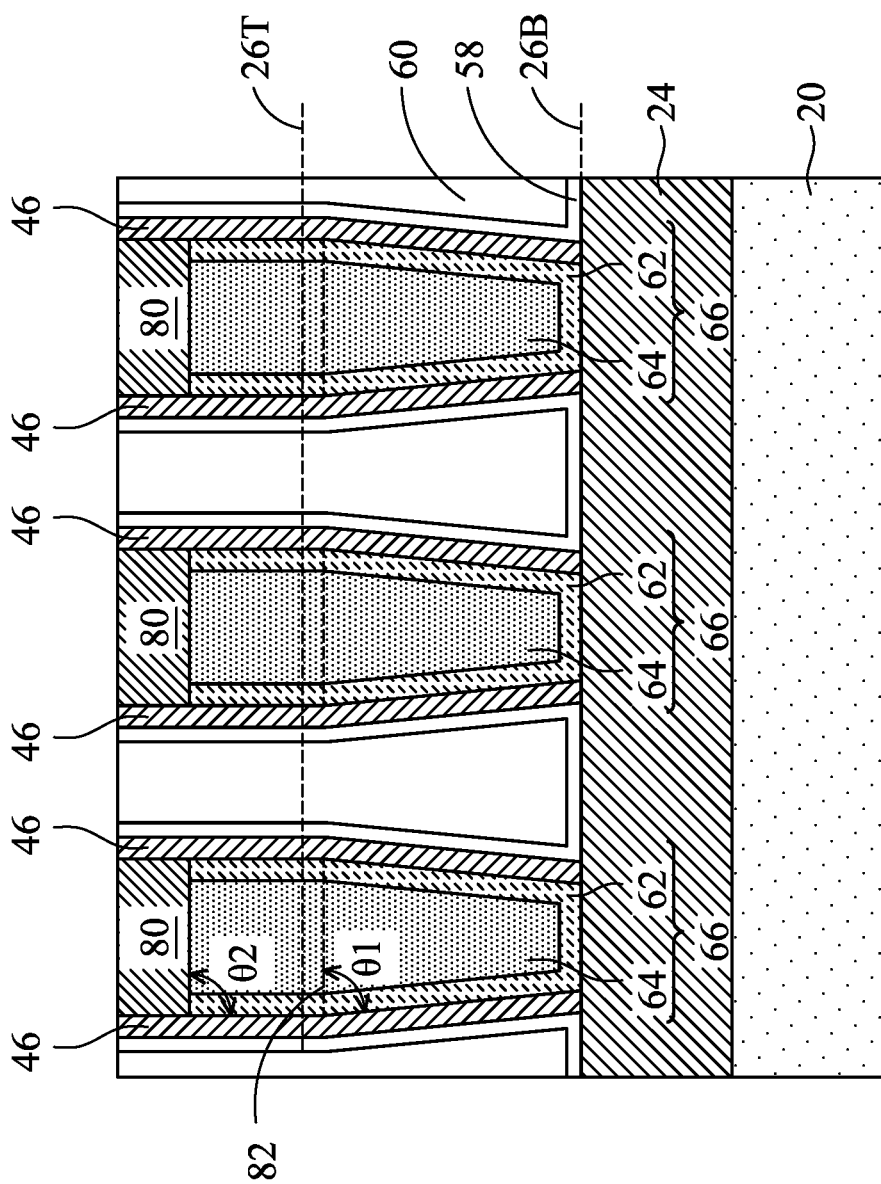
Figure 12:
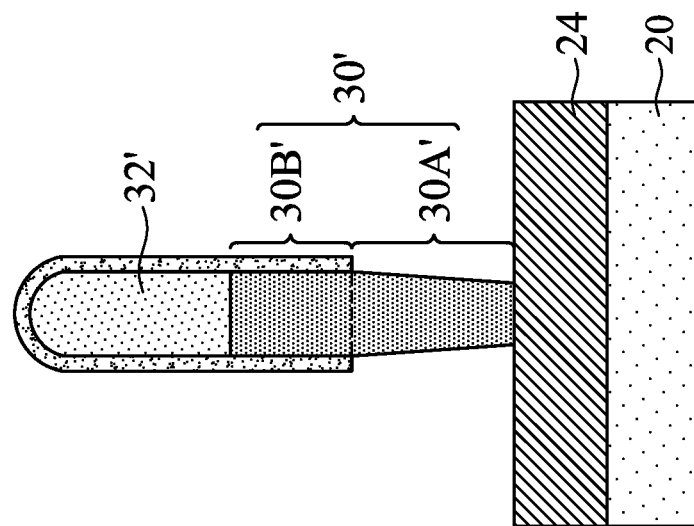
FIGS. 12-15 are cross-sectional views of intermediate stages in the formation of replacement gates with two transition regions in accordance with some embodiments.

FIG. 11B-1 illustrates the embodiments in which the joining level 82 of the lower portions 66A' and the corresponding upper portions 66B' is higher than the top surface 26T of protruding fin 26'. FIG. 11B-2 illustrates the embodiments in which the joining level 82 is level with the top surface 26T of protruding fin 26'. FIG. 11B-3 illustrates the embodiments in which the joining level 82 is lower than the top surface 26T of protruding fin 26'. The adjustment of joining level 82 may include adjusting when to transit from process 36 (FIG. 6B) to process 40 (FIG. 6C), adjusting the pressure, power, gas flow, and etching time of etching processes 36 and 40. For example, increasing pressure and power of the etching process may help to form a thick-enough byproduct layer on the sidewalls of the lower portion of dummy gate electrode 30', and hence may help to achieve the embodiments in FIG. 11B-3. It is also appreciated that since the high-k dielectric layer of gate dielectric 62 may be conformal, the above-discussed tilt angles of gate stacks 66 may also be equal to the tilt angles of the sidewalls of the corresponding portions of gate electrodes 64.

In accordance with some embodiments, two immediate neighboring replacement gate stacks 66 may have their joining levels 82 to be different from each other. For example, one of the two immediate neighboring replacement gate stacks 66 may adopt the one of embodiments as shown in one of FIGS. 11B-1, 11B-2, and 11B-3, while the other one of the two immediate neighboring replacement gate stacks 66 may adopt a different one of embodiments as shown in one of FIGS. 11B-1, 11B-2, and 11B-3.

FIGS. 6F, 6G, 6H, and 6I illustrate the formation of dummy gate stacks 34' in accordance with alternative embodiments. Unless specified otherwise, the materials and the formation processes of the components in these embodiments (and the embodiments in FIGS. 12-23) are essentially the same as the like components, which are denoted by like reference numerals in the preceding embodiments shown in FIGS. 1-4, 5A, 5B, 6, 6A, 6B, 6C, 6D, and 6E. The details regarding the formation process and the materials of the components shown in FIGS. 6F, 6G, 6H, and 6I and FIGS. 12-23 may thus be found in the discussion of the preceding embodiments.

The initial processes are the same as shown in FIGS. 1-4, 5A, and 5B. Next, referring to FIG. 6F, etching process 40 (also denoted as 40A) is performed. The process details are the same as what have been discussed referring to the etching process 40 in FIG. 6C. Accordingly, dummy gate electrode layer 30 is etched, and no byproduct layer is formed. Referring to FIG. 6G, protection layer 38' is deposited, for example, using ALD, CVD, PEALD, PECVD, or the like. The material of protection layer 38' may include SiN, SiON, SiCON, SiC, SiOC, $SiO_2$, or the like. The thickness of protection layer 38' may be in the range between about 2 Å and about 300 Å. Next, referring to FIG. 6H, another etching process 40 (denoted as 40B) is performed, which is performed using essentially the same process conditions as discussed referring to FIG. 6C. Dummy gate electrode layer 30 is thus etched-through to form dummy gate electrode 30'.

Figure 6I:
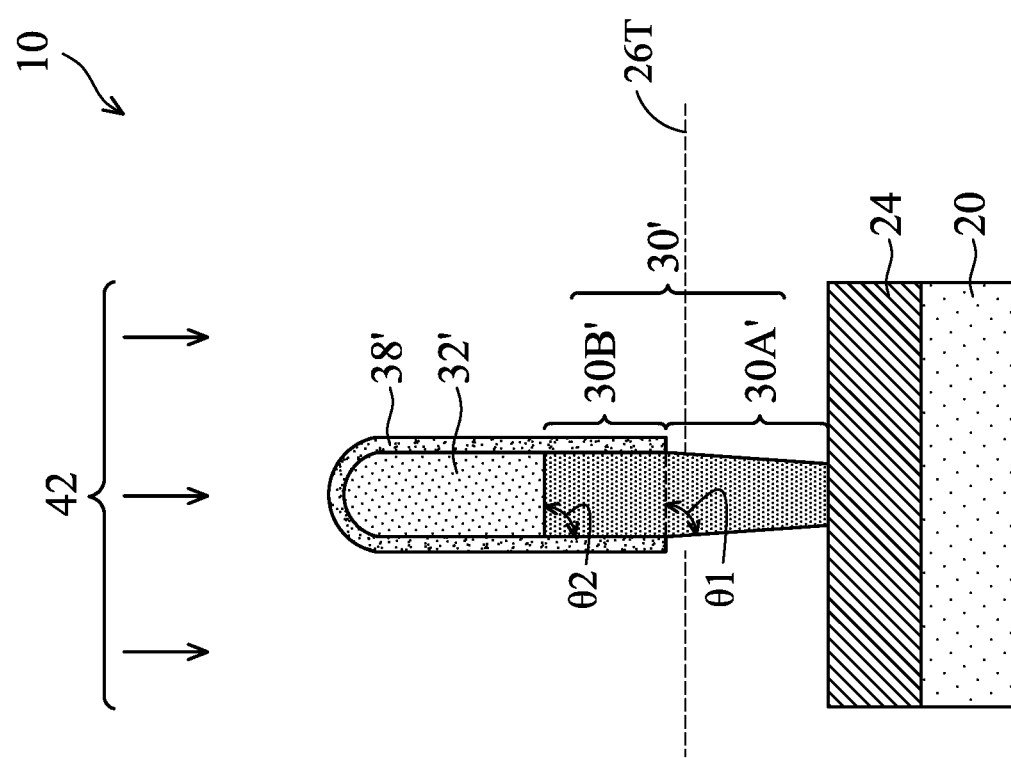

FIG. 6I illustrates etching process 42, which is used to reshape the profile of dummy gate electrode 30'. The process details may be found referring to FIG. 6D, and is not repeated herein. The profile of dummy gate electrode 30' may also be found referring to the discussion of FIG. 6D. Protection layer 38' is then removed through etching. The remaining processes for forming the FinFET 81 are shown in FIGS. 7-11A, 11B-1, 11B-2, and 11B-3.

The dummy gate electrodes 30' as shown in FIGS. 6D and 6I have one narrowing portion (lower portion) 30A' and one transition region, at which the underlying portion starts to narrow down. In accordance with alternative embodiments, dummy gate electrodes may have more than one (such as two, three, four, or more) narrowing portions. FIGS. 12 through 15 illustrate the process for forming a dummy gate electrode 34' with two narrowing portions, with the sidewalls of the lower portions tilted more than the respective upper portions. The process may start from the structure shown in FIG. 6D, and the respective structure is reproduced as FIG. 12. The formation of the structure shown in FIG. 12 accordingly may include the first etching process 36 (FIGS. 6A and 6B), the second etching process 40 (FIG. 6C), and the third etching process 42 (FIG. 6D).

Figure 13:
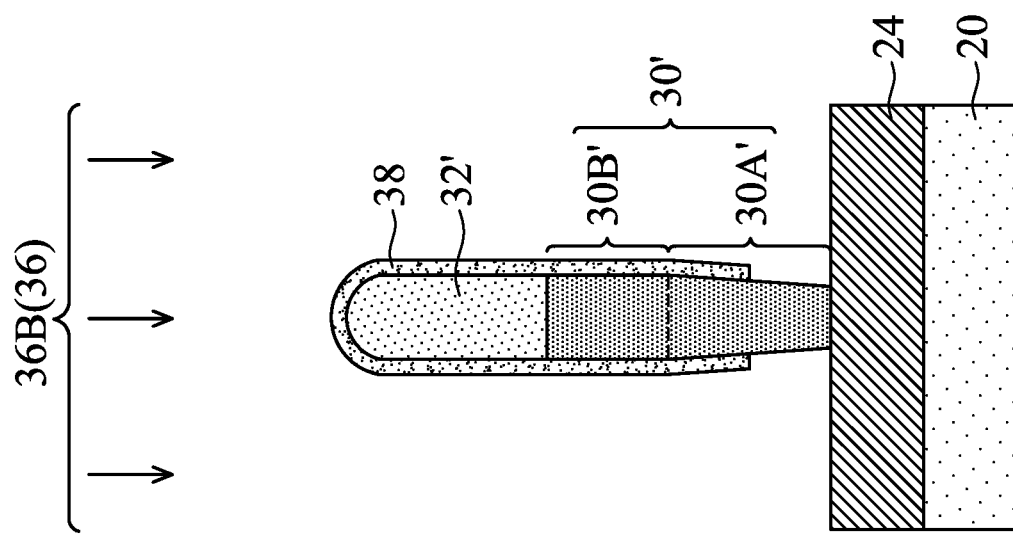

Next, referring to FIG. 13, another etching process 36 (denoted as 36B) is performed. The details of etching process 36 may be found referring to FIGS. 6A and 6B, and the process gas includes the etching gas and the byproduct-generating gas. The lower portion 30A' is actually not etched since the etching is anisotropic. In the meantime, byproduct layer 38 extends downwardly onto the slanted sidewalls of dummy gate electrode 30'. In accordance with some embodiments, the position of the bottom ends of byproduct layer 38 is determined by adjusting the respective process. For example, the pressure of the process gas is adjusted not to be too high, and not to be too low. If the pressure is too high, the byproduct layer 38 extends down too much, and may even be formed as a conformal layer on the entire surface of dummy gate electrode 30'. If the pressure is too low, the byproduct layer 38 cannot extend down for the desirable distance. In accordance with some embodiments, the pressure is in the range between about 1 mTorr and about 800 mTorr. Similarly, a too-high source power may result in the byproduct layer 38 to extend down too much, and a too-low source power may result in the byproduct layer 38 not to extend down enough. In accordance with some embodiments, the source power is in the range between about 10 watts and about 3,000 watts. The bias power is lower than that are used in both etching processes 36 and 40 in order to have both anisotropic and isotropic effect in the etching process. In accordance with some embodiments, the bias power is in the range between about 10 watts and about 3,000 watts. Furthermore, $N_2$ is more active than $O_2$, and more $N_2$ may result in byproduct layer 38 to extend more. In accordance with some embodiments, the etching process as shown in FIG. 13 has a higher (for example, more than 50 percent) flow rate of $N_2$, and/or a lower (for example, lower than 50 percent) flow rate of $O_2$ than the etching process 36 in FIGS. 6A and 6B.

Figure 14:
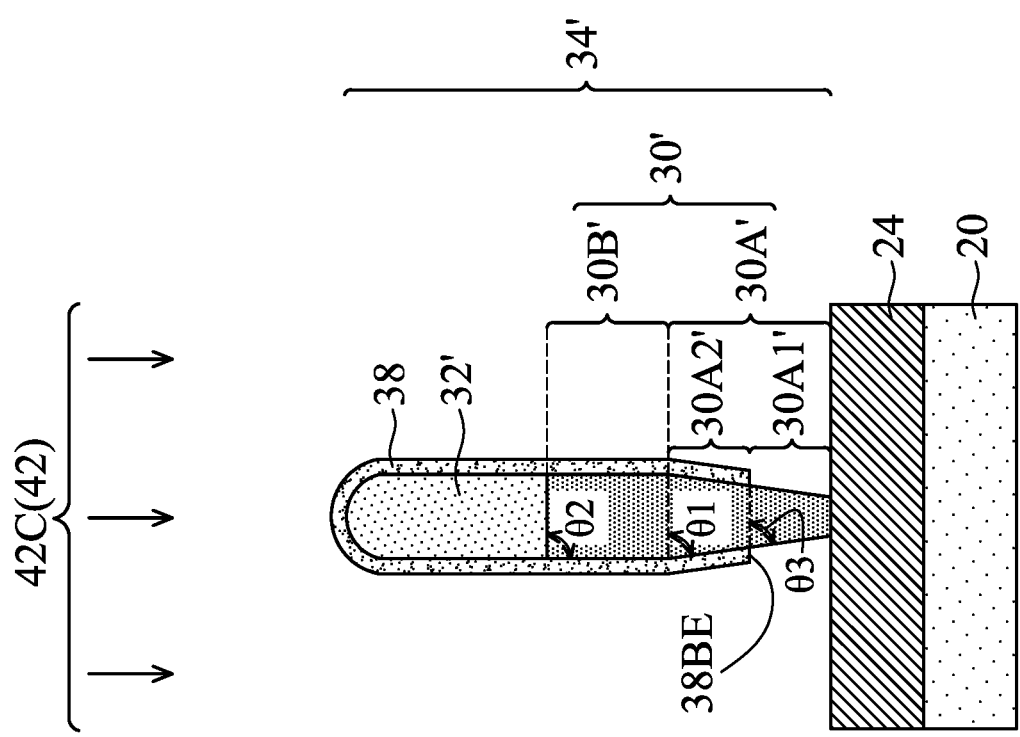

FIG. 14 illustrates another etching process 42 (denoted as 42C). The process condition may be essentially the same as in FIG. 6D. Alternatively, the bias power may be further reduced than used in the process 42 shown in FIG. 6D. As a result, the portions of dummy gate electrode 30' underlying the bottom end 38BE of byproduct layer 38 are etched, and the sidewalls become further tilted (and may be straight). The lower portion 30A' thus includes portions 30A1' and 30A2', which have tilt angles θ3 and θ1, respectively. Tilt angle θ3 is smaller than tilt angle θ1, which is further smaller than tilt angle θ2. In accordance with some embodiments, angle difference (θ2−θ1) and the angle difference (θ1−θ3) are greater than about 2 degrees, 5 degrees, or 10 degrees, and may be in the range between about 1 degrees and about 30 degrees.

Figure 15:
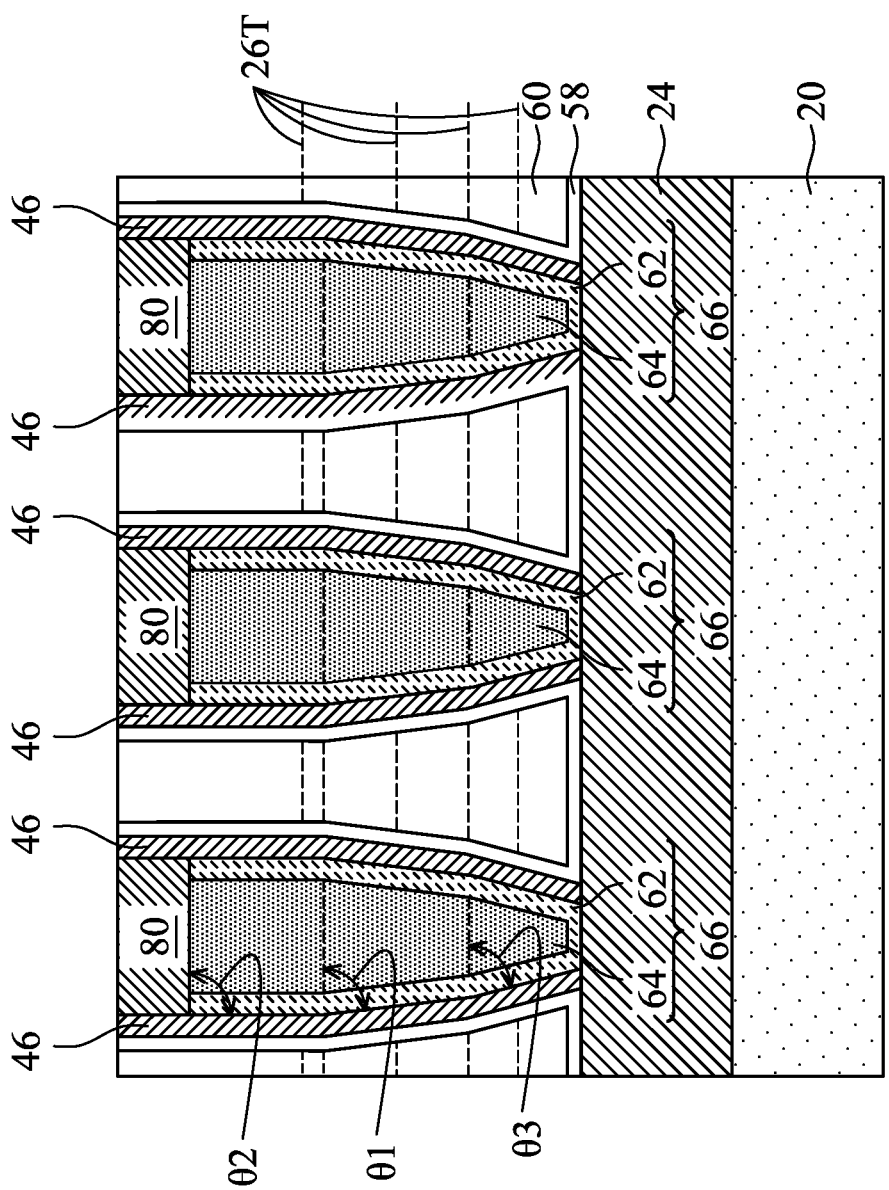

FIG. 15 illustrates replacement gate stacks 66, which replace the dummy gate stacks 34' in FIG. 14. The resulting replacement gate stacks 66 have the same profile as dummy gate stack 34', and have the tilt angles θ1, θ2, and θ3 as discussed referring to FIG. 14. The possible levels of top surface 26T of the protruding fins 26' are also illustrated.

Figure 16:
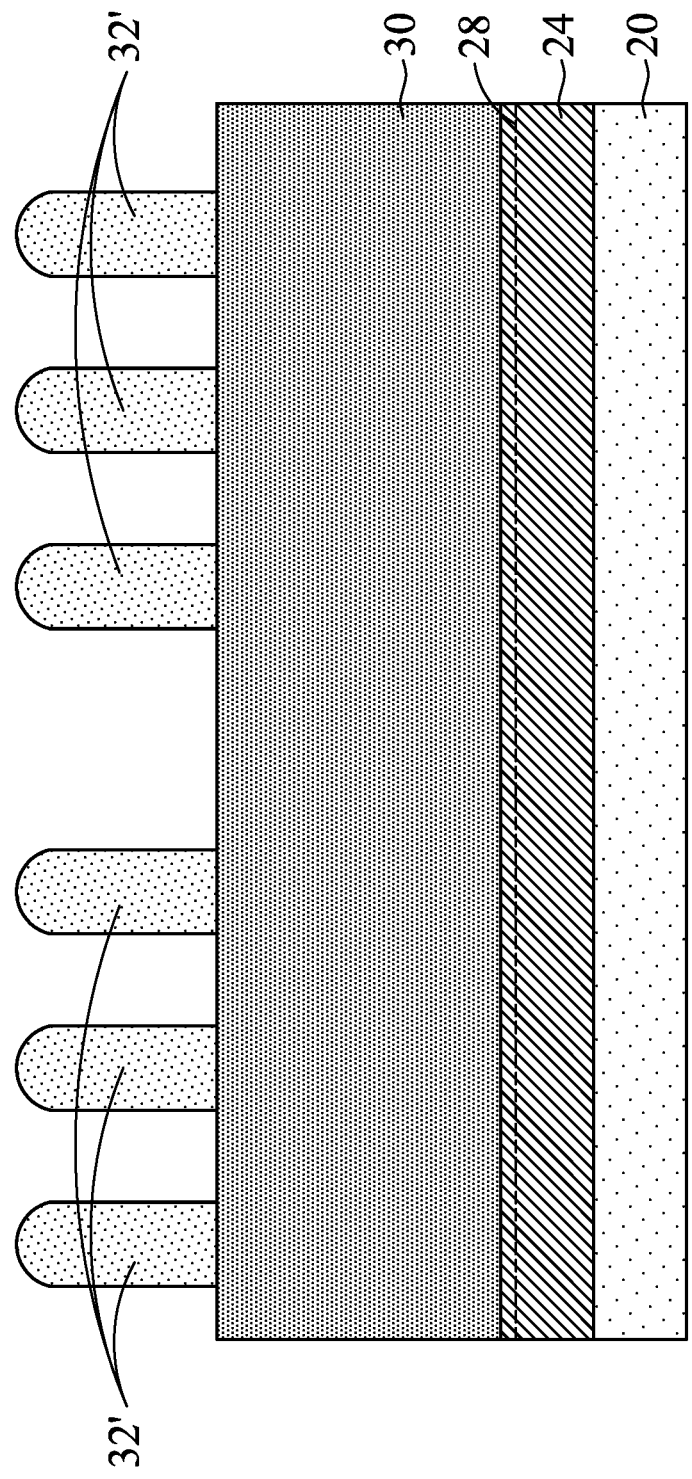
FIGS. 16-23 are cross-sectional views of intermediate stages in the formation of replacement gates with the transition regions formed for selected sidewalls of selected replacement gates in accordance with some embodiments.

FIGS. 16 through 23 illustrate the process for selectively reshaping dummy gate stacks 34' in accordance with some embodiments. Again, the details of the processes and the materials of these embodiments may be found from the like processes and materials as discussed in preceding embodiments. Referring to FIG. 16, STI region 24 is formed extending into substrate 20. Dummy gate dielectric layer 28, dummy gate electrode layer 30, and hard masks 32' are formed. The formation processes are essentially the same as shown in FIGS. 1-4, 5A, and 5B, and are not repeated herein. Again, since the cross-sectional view in FIG. 16 is obtained crossing STI region 24, and both gate dielectric layer 28 and STI region 24 are dielectrics, gate dielectric layer 28 is not shown separately in subsequent figures.

Figure 17:
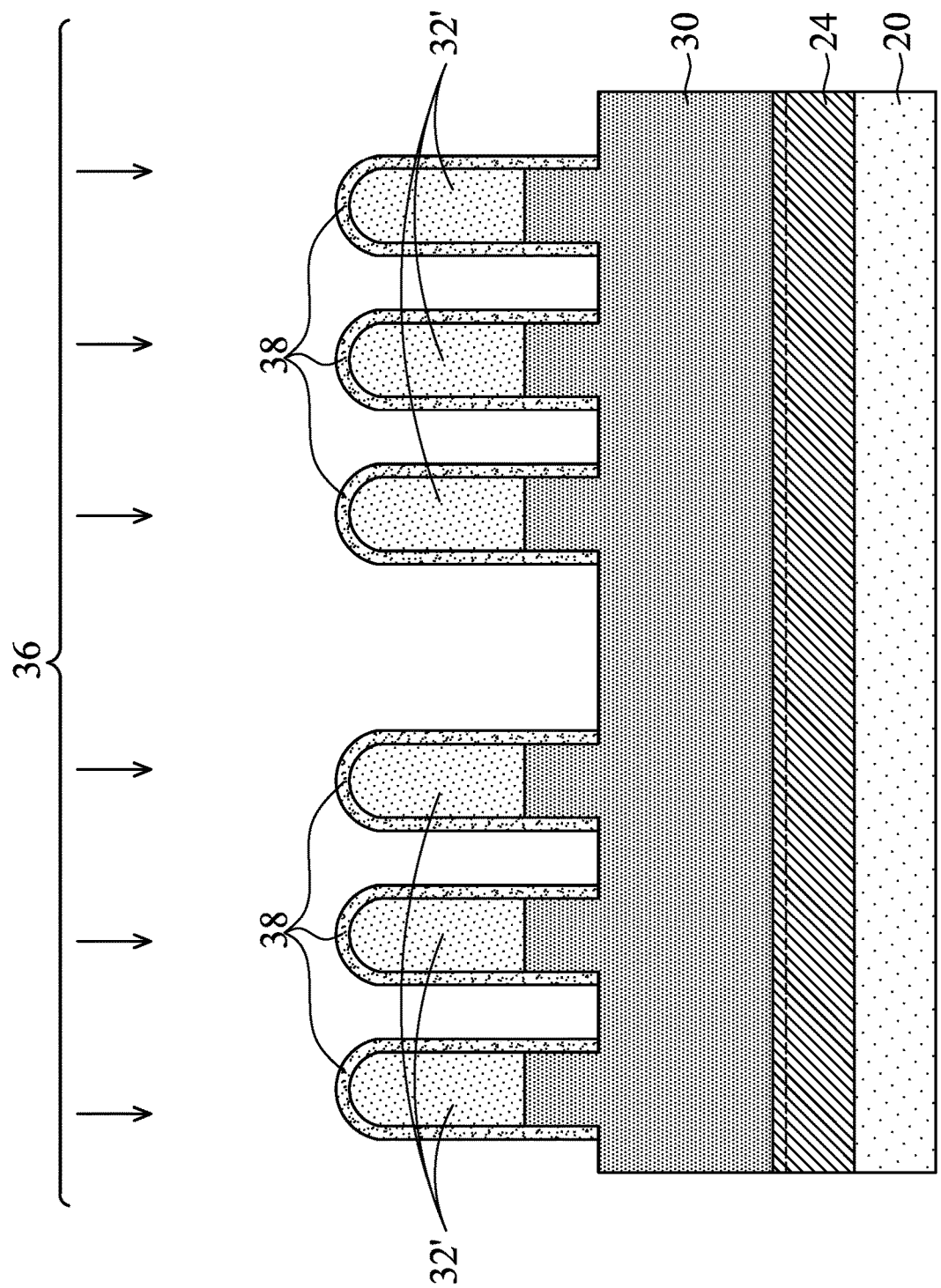
Figure 18:
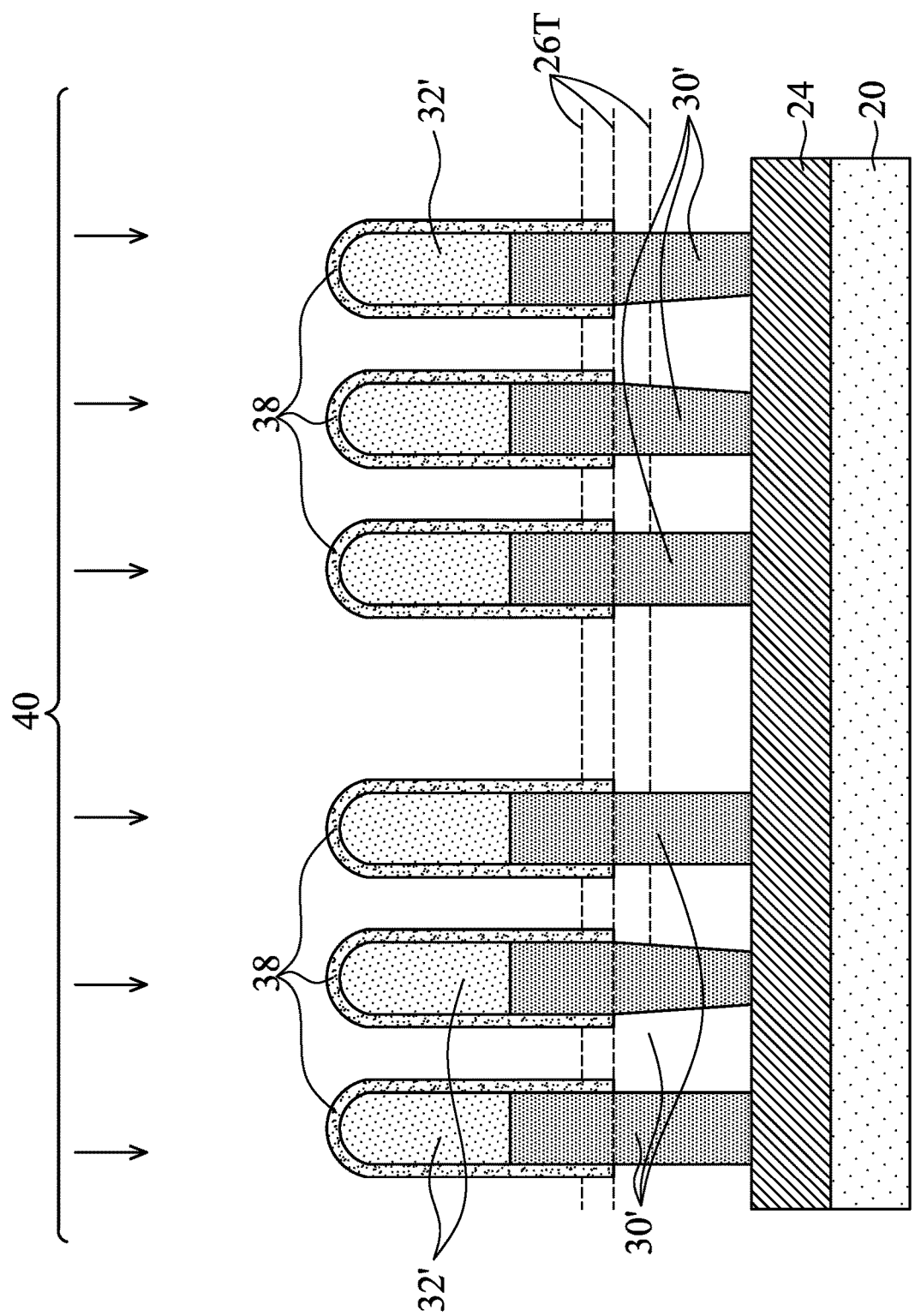

FIG. 17 illustrates the etching process 36, whose details may be found referring to FIGS. 6A and 6B. Byproduct layer 38 is thus formed. Next, referring to FIG. 18, etching process 40 is performed to etch-through dummy gate electrode layer 30 and to form dummy gate electrode 30'. The details of etching processes 36 and 40 may be found from the preceding embodiments. There is no byproduct layer newly formed by etching process 40, or the byproduct layer, if formed, is thin, similar to what is shown in FIG. 6C. Again, the bottom ends of byproduct layer 38 may be higher than, level with, or lower than, the top surface 26T (the possible levels are illustrated) of protruding fins 26'.

Figure 19:
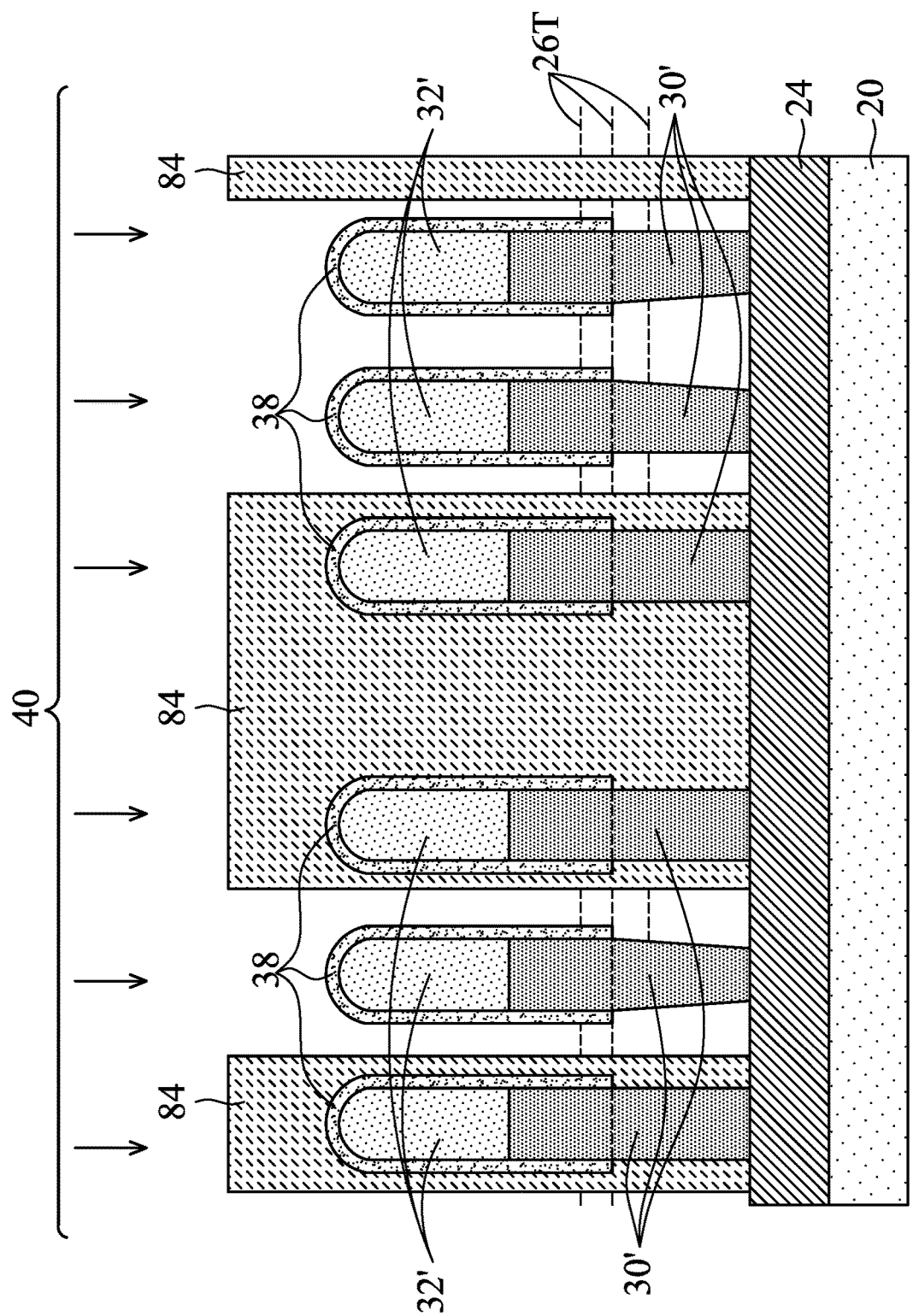
Figure 20:
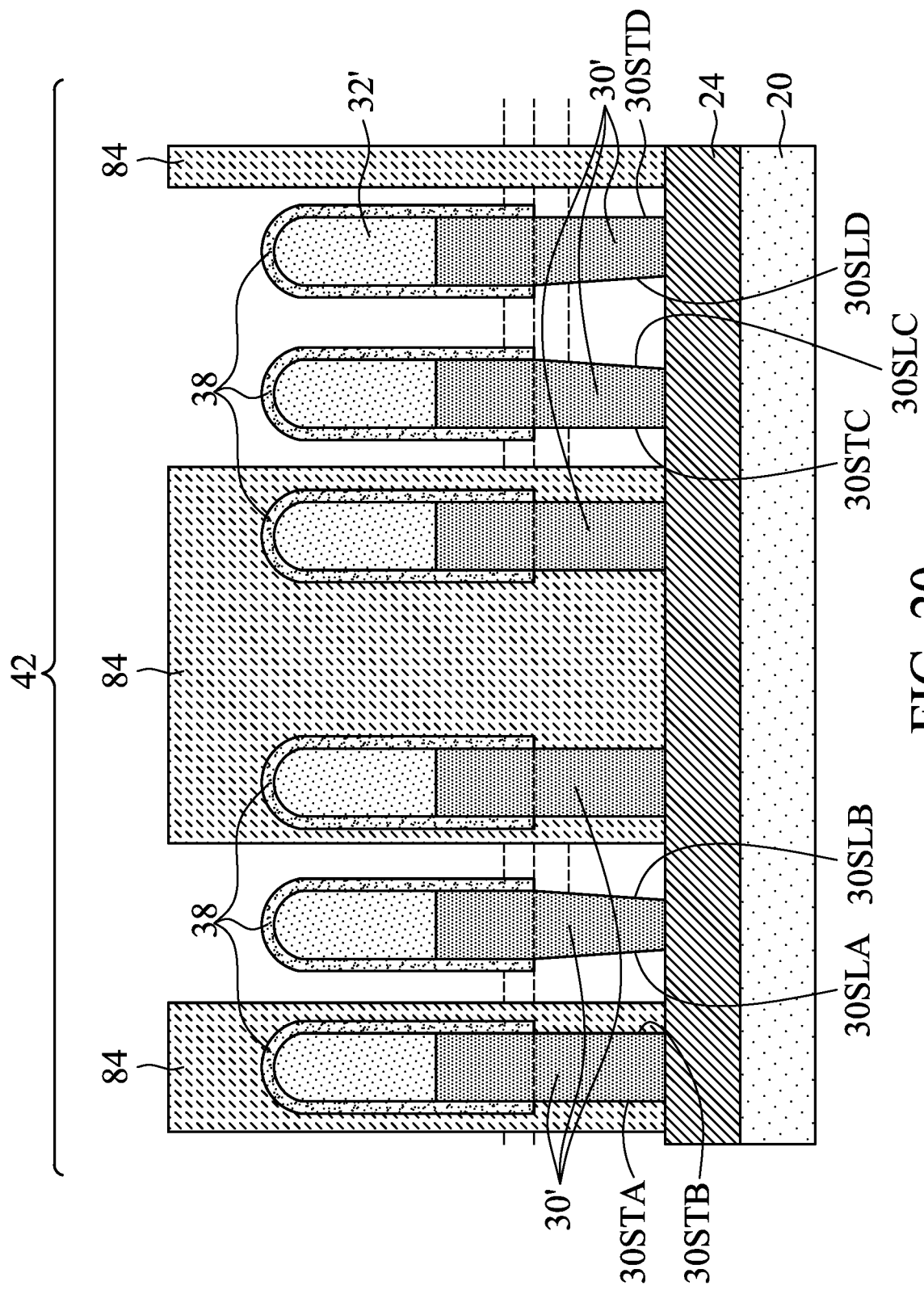

FIG. 19 illustrates the formation of etching mask 84, which may be photo resist in accordance with some embodiments. Etching mask 84 protects some of the dummy gate electrodes 30' partially or entirely, and leaves some other dummy gate electrodes 30' uncovered. Next, referring to FIG. 20, etching process 42 is performed. The details of etching process 42 may be found from the preceding embodiments. The sidewalls of the dummy gate electrodes 30' exposed to the etching gas are reshaped. The profiles of the reshaped sidewalls may be essentially the same as the reshaped sidewalls as shown in FIG. 6D, and the details may be found referring to the discussion of FIG. 6D. The other sidewalls of the dummy gate electrodes 30' protected by etching mask 84 are not reshaped. Furthermore, an example is also shown with the right sidewall of the right-most dummy gate electrode 30' not reshaped since the distance of the sidewall is close to the etching mask enough, so that the etching gas cannot reach the sidewall. Throughout the description, the reshaped (and hence more slanted) sidewalls are denoted as 30SL (with SL meaning "slanted"), and the non-reshaped (and hence straighter) sidewalls are denoted as 30ST (with ST meaning "straighter"). Also, letter "A," "B," "C," "D," or the like are added for identifying individual sidewalls. The profiles of dummy gate electrodes 30' are discussed referring to FIGS. 22 and 23.

Figure 21:
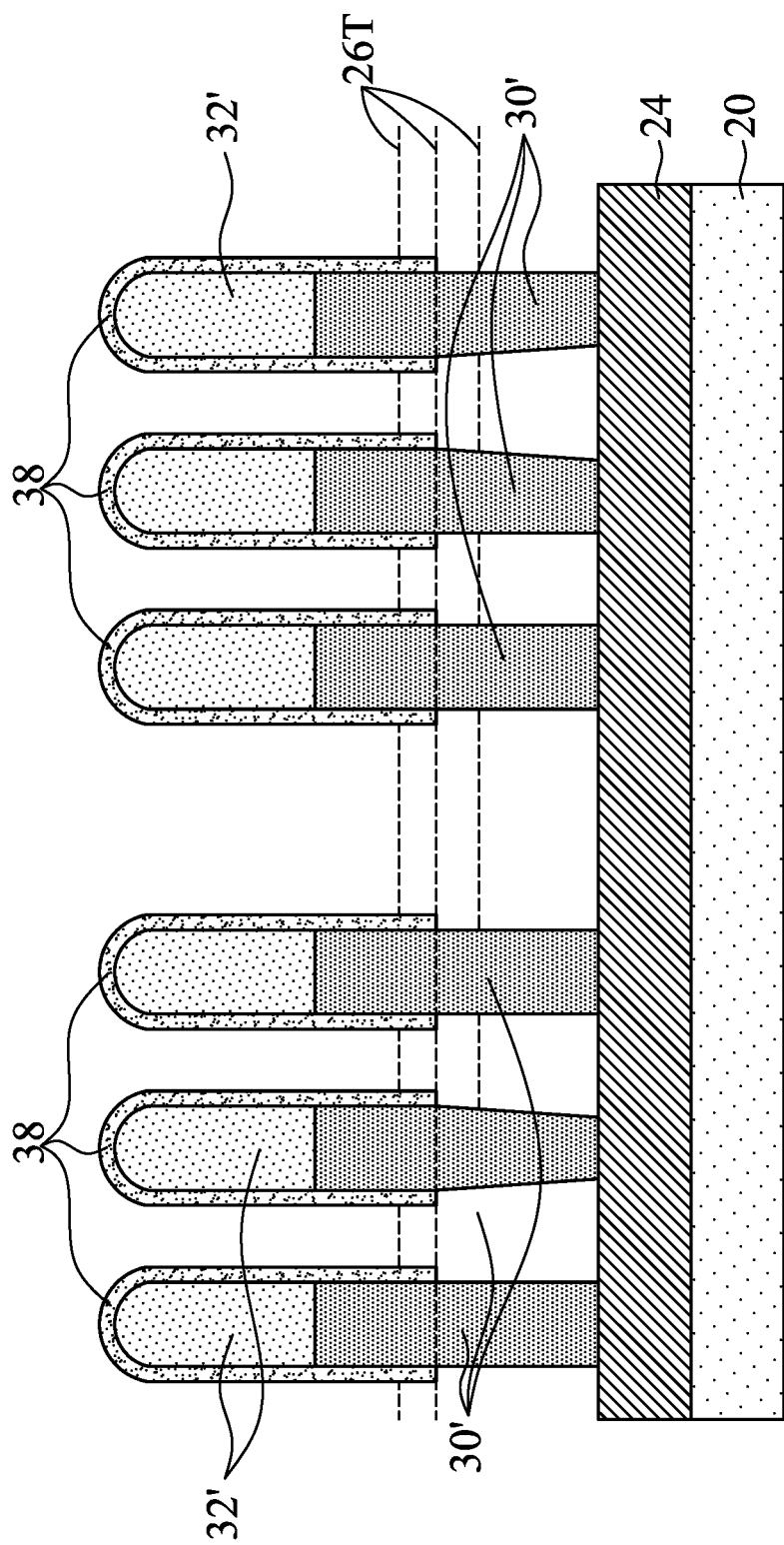
Figure 22:
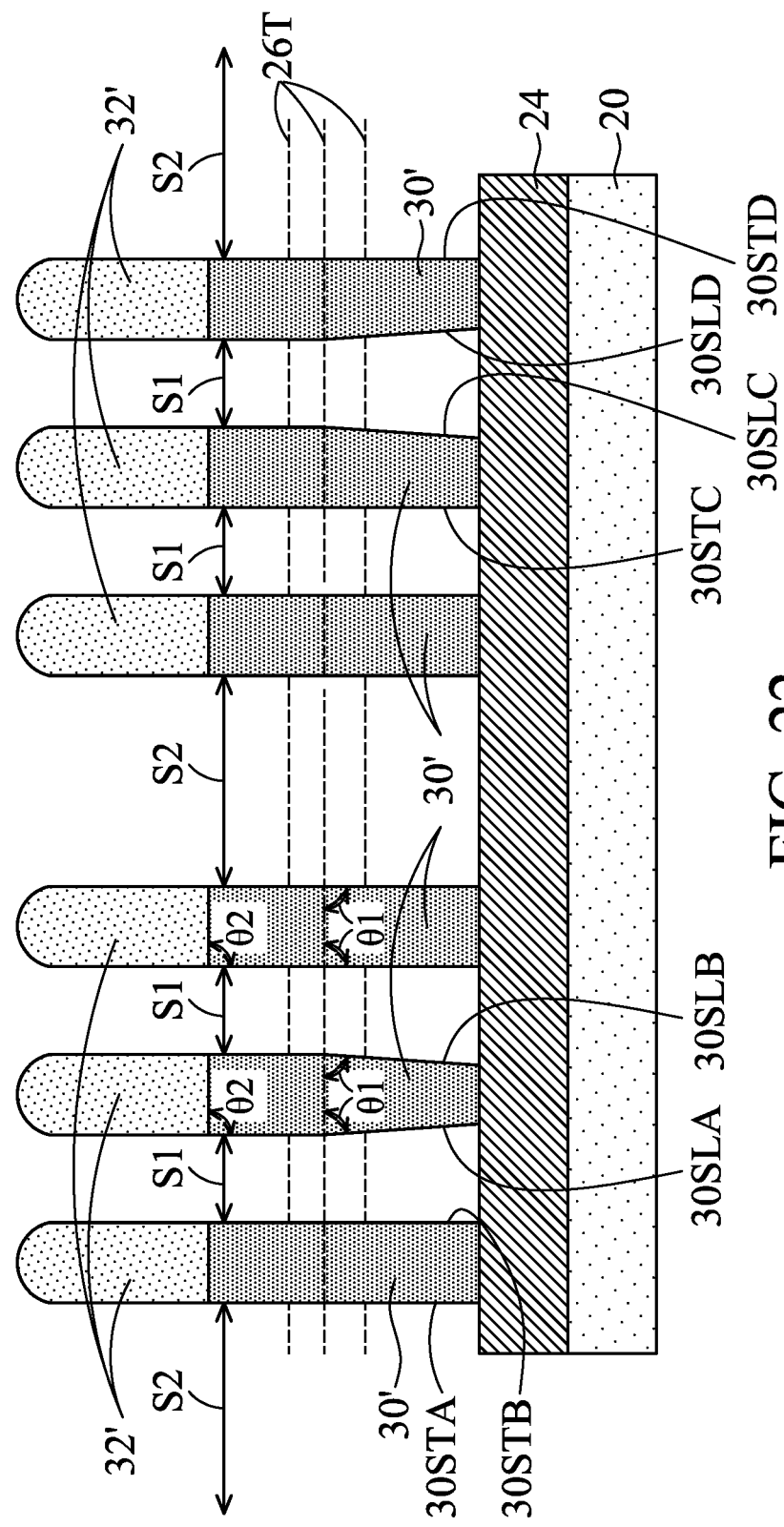

Next, etching mask 84 is removed, and the resulting structure is shown in FIG. 21. Byproduct layer 38 is then removed, and the resulting structure is shown in FIG. 22. The remaining processes for forming FinFETs, which are similar to the FinFET 81, are shown in FIGS. 7-10, 11A, 11B-1, 11B-2, and 11B-3. The corresponding replacement gate stacks 66, which replace dummy gate stacks 34', are shown in FIG. 23.

Figure 23:
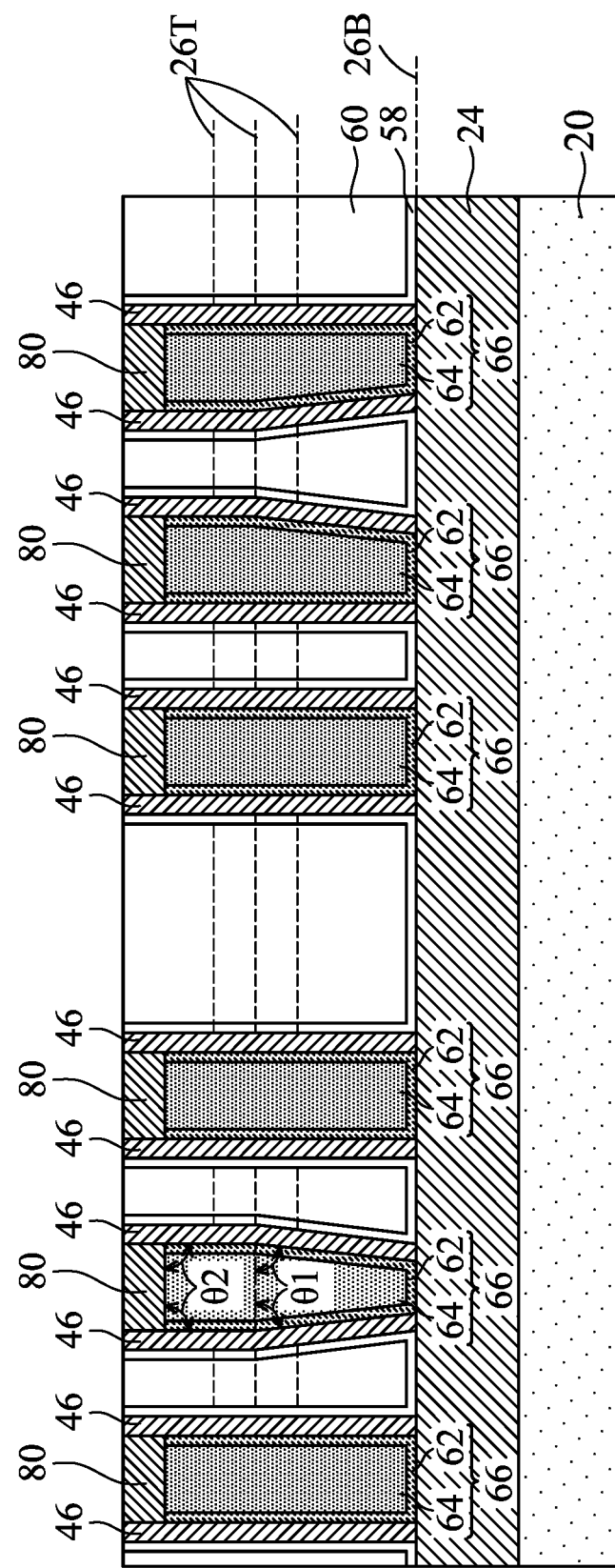

FIGS. 22 and 23 illustrate the profiles such as the slanted edges and the tilt angles θ1 and θ2 of dummy gate electrodes 30' and replacement gate stacks 66. Some of the sidewalls of dummy gate electrodes 30' and replacement gate stacks 66 have more tilted lower portions than the respective upper portions. For example, lower sidewall portions 30SLA, 30SLB, 30SLC, and 30SLD are more tilted than the respective upper portions of the respective sidewalls. On the other hand, some other lower dummy portions 30STA, 30STB, 30STC, and 30STD and their corresponding upper portions form continuous straight sidewalls. Furthermore, a dummy gate electrode 30' (and the corresponding replacement gate electrode), such as the second dummy gate electrode 30' counting from the right side of FIG. 22 may have one slanted lower sidewall, while the opposing sidewall is straight and less tilted. Some dummy gate electrode 30' may have sidewalls with both lower portions being more slanted than the upper portions, and some other dummy gate electrode 30' may have sidewalls with both lower portions having the same tilt angles as the corresponding upper portions.

Furthermore, the embodiments in FIG. 15 may also be applied to the embodiments in FIGS. 16 through 23, so that each of the slanted sidewalls 30SLA, 30SLB, 30SLC, and 30SLD may have more than one, such as between about 2 and about 10, straight and slanted portions, with each of the lower portions being straight and increasingly more slanted than the respective upper portions.

In accordance with some embodiments, distances S1 between some fins are smaller than distances S2. For example, ratio S2/S1 is greater than about 2.0. The dummy gate electrodes 30' having distances S1 are referred to as being in a pattern-dense region, and the dummy gate electrodes 30' having distances S2 are referred to as being in a pattern-iso region. The sidewall profiles of dummy gates and replacement gates may be affected by whether the respective FinFETs are in pattern-dense or pattern-iso regions, which sidewall profile may not be desirable. In accordance with some embodiments of the present disclosure, by forming etching mask 84 in selected regions, the sidewall profile of dummy gate electrodes 30' is controllable, and are not determined by whether the respective dummy gate electrodes 30' are in pattern-dense or pattern-iso regions, and may be adjusted individually through etching mask 84.

The embodiments as shown in FIG. 23 may be used for satisfying both of the performance requirement and the reliability requirement. For example, for the dummy gate electrodes with narrowing lower portions, the respective transistors have better performance. The dummy gate electrodes of these transistors, however, are prone to collapsing. The FinFETs whose dummy gate electrodes are straight, on the other hand, are less prone to collapsing, but the performance of the resulting FinFETs may be not as good as those FinFETs with narrowing lower portions. By adopting the embodiments as shown in FIGS. 16-23, the performance-demanding FinFETs may adopt slanted sidewalls, while other FinFETs may adopt straight sidewalls to have better yield.

The embodiments of the present disclosure have some advantageous features. By etching dummy gate electrodes to have tapered lower portions, the performance of the resulting FinFETs is improved, and the saturation current is increased. By selectively forming slanted sidewalls for selected dummy gate electrodes, the requirement of improving performance and reliability is balanced.

In accordance with some embodiments of the present disclosure, a method includes depositing a dummy gate dielectric layer over a semiconductor region; depositing a dummy gate electrode layer over the dummy gate dielectric layer; performing a first etching process, wherein an upper portion of the dummy gate electrode layer is etched to form an upper portion of a dummy gate electrode; forming a protection layer on sidewalls of the upper portion of the dummy gate electrode; performing a second etching process, wherein a lower portion of the dummy gate electrode layer is etched to form a lower portion of the dummy gate electrode; performing a third etching process to etch the lower portion of the dummy gate electrode using the protection layer as an etching mask, wherein the dummy gate electrode is tapered by the third etching process; removing the protection layer; and replacing the dummy gate electrode with a replacement gate electrode. In an embodiment, the protection layer is formed simultaneously when the first etching process is performed. In an embodiment, the first etching process is performed using a process gas comprising an etching gas and a byproduct-generating gas. In an embodiment, the method further comprises, after the second etching process and before the third etching process, forming an additional etching mask to cover an additional dummy gate electrode; and after the third etching process, removing the additional etching mask. In an embodiment, the protection layer is a byproduct layer generated by the first etching process, and the protection layer comprises silicon and oxygen atoms. In an embodiment, the byproduct layer further comprises bromine and chlorine. In an embodiment, the first etching process and the second etching process are anisotropic, and the third etching process has both of an anisotropic effect and an isotropic effect. In an embodiment, the first etching process and the second etching process are preformed using first bias powers, and the third etching process is performed using a second bias power lower than the first bias powers. In an embodiment, the removing the protection layer is achieved through etching.

In accordance with some embodiments of the present disclosure, a structure includes a protruding semiconductor fin; a first gate stack on the protruding semiconductor fin, wherein the first gate stack comprises a first sidewall comprising a first lower straight portion having a first tilt angle; and a first upper straight portion having a second tilt angle greater than the first tilt angle; and a first gate spacer contacting both of the first lower straight portion and the first upper straight portion of the first gate stack. In an embodiment, the first gate stack further comprises a second sidewall opposing the first sidewall, and wherein the second sidewall comprises a second lower straight portion having the first tilt angle; and a second upper straight portion having the second tilt angle. In an embodiment, the first gate stack further comprises a second sidewall opposing the first sidewall, and wherein substantially an entirety of the second sidewall is straight. In an embodiment, the structure further includes a second gate stack comprising a third sidewall, and wherein substantially an entirety of the third sidewall is straight. In an embodiment, the first sidewall of the first gate stack further comprises a bottom straight portion lower than, and joined to, the first lower straight portion, wherein the bottom straight portion has a third tilt angle smaller than the first tilt angle. In an embodiment, a difference between the second tilt angle and the first tilt angle is greater than about 5 degrees.

In accordance with some embodiments of the present disclosure, a structure includes a semiconductor fin; a gate dielectric on the semiconductor fin; a gate electrode over the gate dielectric, wherein the gate electrode comprises an upper portion having a first sidewall; and a lower portion underlying and joined to the upper portion, wherein the lower portion has a second sidewall joined to the first sidewall, and wherein the first sidewall is more up straight than the second sidewall, and there is an abrupt change in tilting angles of the first sidewall and the second sidewall; and a gate spacer contacting the first sidewall and the second sidewall. In an embodiment, the gate electrode further comprises a bottom portion underlying and joined to the lower portion, wherein the bottom portion has a third sidewall joined to the second sidewall, and wherein the third sidewall is more tilted than the second sidewall, and there is an abrupt change in tilting angles of the second sidewall and the third sidewall. In an embodiment, the upper portion further comprises a third sidewall opposing the first sidewall, and the lower portion further comprises a fourth sidewall opposing the second sidewall, and wherein there is an abrupt change in tilting angles of the third sidewall and the fourth sidewall. In an embodiment, the upper portion further comprises a third sidewall opposing the first sidewall, and the lower portion further comprises a fourth sidewall opposing the second sidewall, and wherein the third sidewall and the fourth sidewall are parts of a same continuous and straight sidewall. In an embodiment, the gate electrode comprises metal, and the gate dielectric comprises a high-k dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dummy gate dielectric layer over a semiconductor region;
   depositing a dummy gate electrode layer over the dummy gate dielectric layer;
   performing a first etching process, wherein an upper portion of the dummy gate electrode layer is etched to form an upper portion of a dummy gate electrode;
   forming a protection layer on sidewalls of the upper portion of the dummy gate electrode;
   performing a second etching process, wherein a lower portion of the dummy gate electrode layer is etched to form a lower portion of the dummy gate electrode;
   after the second etching process, forming an additional etching mask to cover an additional dummy gate electrode;
   after the additional etching mask is formed, performing a third etching process to etch the lower portion of the dummy gate electrode using the protection layer as an etching mask, wherein the dummy gate electrode is tapered by the third etching process;
   after the third etching process, removing the additional etching mask;
   removing the protection layer; and
   replacing the dummy gate electrode with a replacement gate electrode.

2. The method of claim 1, wherein the protection layer is formed simultaneously when the first etching process is performed.

3. The method of claim 2, wherein the first etching process is performed using a process gas comprising an etching gas and a byproduct-generating gas.

4. The method of claim 1, wherein the protection layer is a byproduct layer generated by the first etching process, and the protection layer comprises silicon and oxygen atoms.

5. The method of claim 4, wherein the byproduct layer further comprises bromine and chlorine.

6. The method of claim 1, wherein the first etching process and the second etching process are anisotropic, and the third etching process has both of an anisotropic effect and an isotropic effect.

7. The method of claim 1, wherein the first etching process and the second etching process are preformed using first bias powers, and the third etching process is performed using a second bias power lower than the first bias powers.

8. The method of claim 1, wherein the removing the protection layer is achieved through etching.

9. A method comprising:
   performing a first etching process on an upper portion of a dummy gate electrode layer, wherein first remaining portions of the etched upper portion of the dummy gate electrode layer comprise an upper part of a dummy gate electrode, and during the first etching process, a byproduct layer is formed on sidewalls of the first remaining portions;
   after the first etching process, conducting a byproduct-generating gas to increase a thickness of the byproduct layer;
   after the thickness of the byproduct layer is increased, performing a second etching process on a lower portion of the dummy gate electrode, wherein second remaining portions of the etched lower portion of the dummy gate electrode comprise a lower part of the dummy gate electrode;
   using the byproduct layer as a part of an etching mask to etch the lower part of the dummy gate electrode;
   forming gate spacers on opposing sides of the dummy gate electrode;
   removing the dummy gate electrode to form a trench between opposing portions of the gate spacers; and forming a replacement gate electrode extending into the trench.

10. The method of claim 9, wherein in the second etching process, no byproduct layer is formed on sidewalls of the lower part of the dummy gate electrode.

11. The method of claim 9, wherein in the second etching process, an additional byproduct layer is formed on sidewalls of the lower part of the dummy gate electrode, and the additional byproduct layer is thinner than the byproduct layer.

12. The method of claim 9 further comprising, before the forming the gate spacers, removing the byproduct layer.

13. The method of claim 9 further comprising, after both of the first etching process and the second etching process, performing a third etching process to etch the lower part of the dummy gate electrode to make the lower part of the dummy gate electrode tapered.

14. The method of claim 13, wherein the third etching process is performed with a lower bias power than the first etching process and the second etching process.

15. A method comprising:
forming a semiconductor fin;
forming a dummy gate electrode layer on the semiconductor fin;
performing a first etching process on the dummy gate electrode layer to form an upper portion of a dummy gate electrode, wherein in the first etching process, a first protection layer is simultaneously formed on the upper portion of the dummy gate electrode; and
after the first etching process, performing a second etching process to form a lower portion of the dummy gate electrode, wherein in the second etching process, a second protection layer thinner than the first protection layer is formed on the lower portion of the dummy gate electrode; and
after the second etching process, reshaping the lower portion of the dummy gate electrode to be tapered.

16. The method of claim 15, wherein the reshaping is performed through a third etching process, with the third etching process being more isotropic than the first etching process and the second etching process.

17. The method of claim 15 further comprising, after the reshaping, removing the first protection layer.

18. The method of claim 15 further comprising replacing the dummy gate electrode with a replacement gate electrode.

19. The method of claim 9, wherein the conducting the byproduct-generating gas is selected from the group consisting of $N_2$, $O_2$, $SO_2$, $CO_2$, $CO$, $SiCl_4$, and combinations thereof.

20. The method of claim 15, wherein in the second etching process, a byproduct-generating gas is used along with an etching gas for the second etching process, and the byproduct-generating gas is selected from the group consisting of $N_2$, $O_2$, $SO_2$, $CO_2$, $CO$, and combinations thereof.

* * * * *